(12) United States Patent
Iqbal

(10) Patent No.: US 11,309,793 B2
(45) Date of Patent: Apr. 19, 2022

(54) LATCH-TYPE CHARGE PUMP

(71) Applicant: Ferroelectric Memory GmbH, Dresden (DE)

(72) Inventor: Rashid Iqbal, Dresden (DE)

(73) Assignee: FERROELECTRIC MEMORY GMBH, Dresden (DE)

( * ) Notice: Subject to any disclaimer, the term of this patent is extended or adjusted under 35 U.S.C. 154(b) by 0 days.

(21) Appl. No.: 16/997,299

(22) Filed: Aug. 19, 2020

(65) Prior Publication Data

US 2022/0060105 A1   Feb. 24, 2022

(51) Int. Cl.
*H02M 3/07*    (2006.01)
*H03K 17/687*  (2006.01)
*H02M 1/00*    (2006.01)

(52) U.S. Cl.
CPC .......... *H02M 3/073* (2013.01); *H03K 17/687* (2013.01); *H02M 1/0083* (2021.05)

(58) Field of Classification Search
CPC .......... H02M 3/00; H02M 3/005; H02M 3/02; H02M 3/04; H02M 3/06; H02M 3/07; H02M 3/073; H02M 2003/075; H02M 2003/076; H02M 2003/077; H02M 2003/078; H02M 2001/0083; H02M 2001/0087; H02M 2001/009; H02M 2001/0093; H03K 17/56; H03K 17/687
See application file for complete search history.

(56) References Cited

U.S. PATENT DOCUMENTS

2014/0191115 A1* 7/2014 Webster ............ H01L 27/14609
                                                  250/214 R
2015/0288353 A1* 10/2015 Kalluru ................. G11C 16/30
                                                  365/185.12

* cited by examiner

*Primary Examiner* — Diana J. Cheng
(74) *Attorney, Agent, or Firm* — Hickman Becker Bingham Ledesma LLP; Malgorzata A. Kulczycka

(57) ABSTRACT

According to various aspects, a latch-type charge pump may include: an input node and an output node; a first charge storage and a second charge storage coupled in parallel to each other, a first switch coupled to the input node and a second switch coupled to the output node, wherein the first charge storage couples the first switch with the second switch; and a control circuit configured to control the first switch based on a state of the second charge storage, and to control the second switch based on a state of the first charge storage.

20 Claims, 15 Drawing Sheets

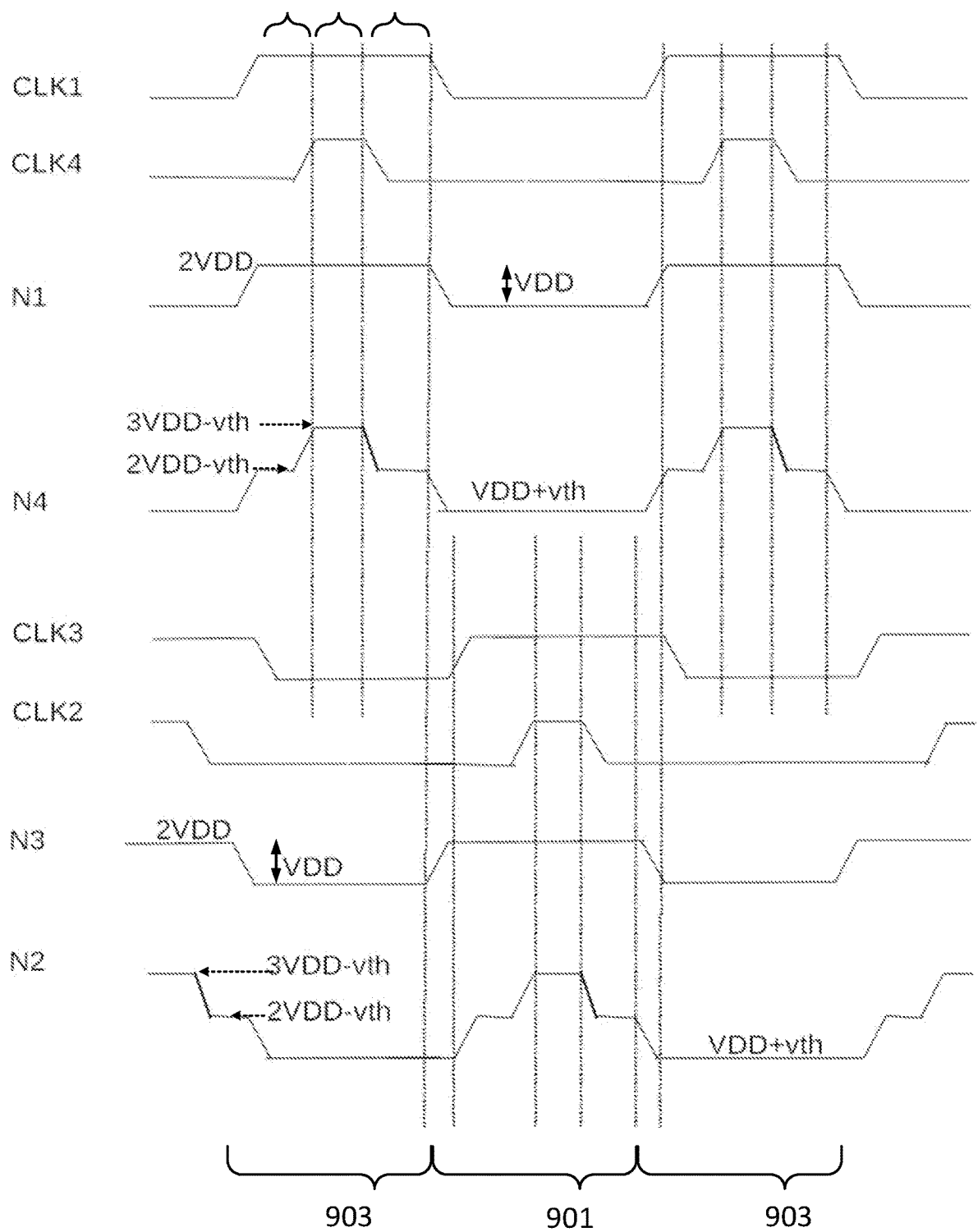

LATCH-TYPE CHARGE PUMP

TECHNICAL FIELD

Various aspects relate generally to a latch-type charge pump.

BACKGROUND

Conventional inverters and latch-type charge pumps are fabricated in CMOS-technology (complementary metal-oxide-semiconductor technology). CMOS-technology is a type of metal-oxide-semiconductor field-effect transistor (MOSFET) fabrication process that uses complementary and symmetrical pairs of p-type and n-type MOSFETs for logic functions.

BRIEF DESCRIPTION OF THE DRAWINGS

Throughout the drawings, it should be noted that like reference numbers are used to depict the same or similar elements, features, and structures. The drawings are not necessarily to scale, emphasis instead generally being placed upon illustrating aspects of the disclosure. In the following description, some aspects of the disclosure are described with reference to the following drawings, in which:

FIG. 15 shows a schematic view of various control signals of the control circuit according to various aspects in a diagram.

DESCRIPTION

Figure 1:
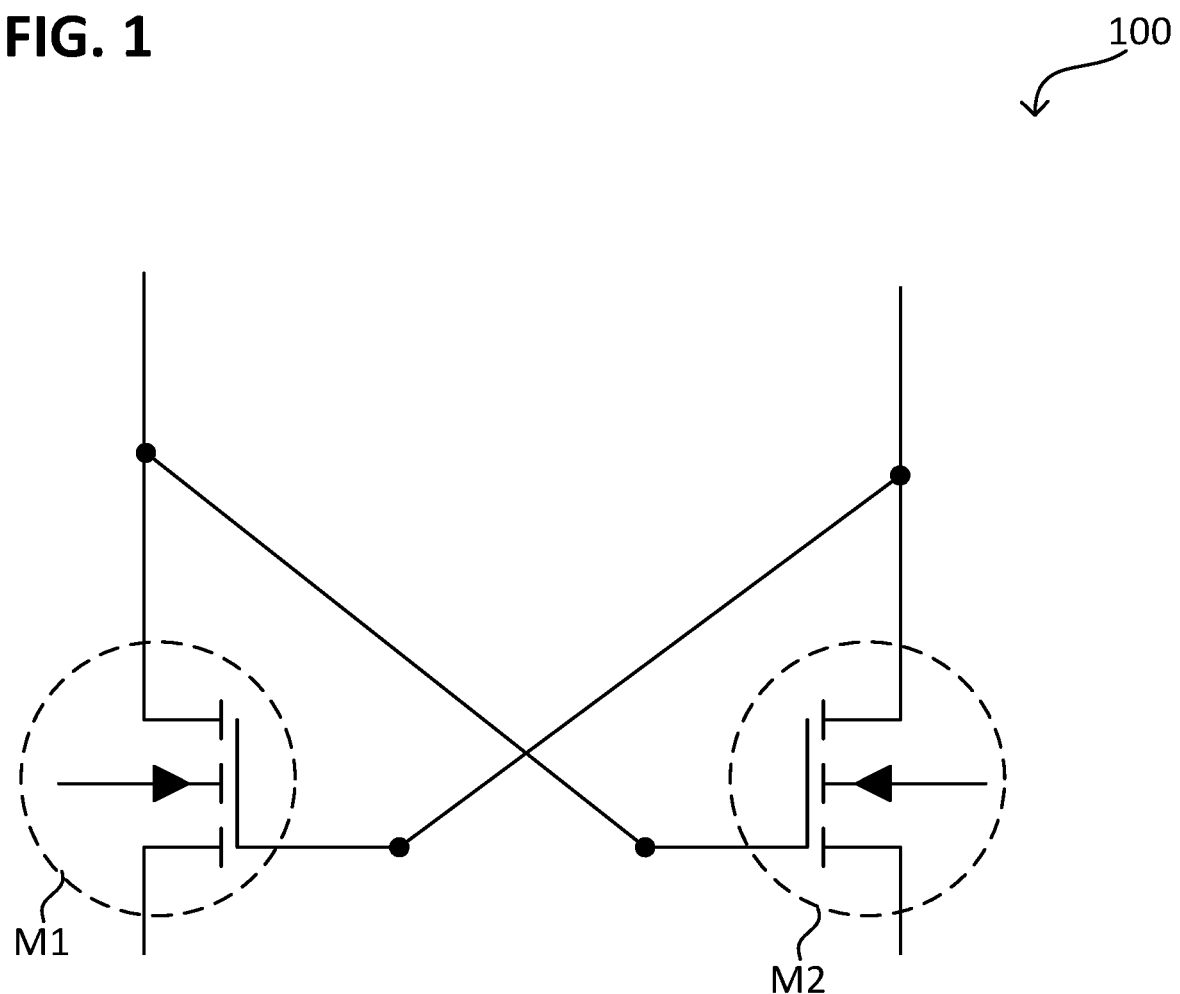
FIG. 1 shows a schematic view of a latch structure according to various aspects in a circuit diagram.

The following detailed description refers to the accompanying drawings that show, by way of illustration, specific details and aspects in which the invention may be practiced. These aspects are described in sufficient detail to enable those skilled in the art to practice the invention. Other aspects may be utilized and structural, logical, and electrical changes may be made without departing from the scope of the invention. The various aspects are not necessarily mutually exclusive, as some aspects can be combined with one or more other aspects to form new aspects. Various aspects are described in connection with methods and various aspects are described in connection with devices. However, it may be understood that aspects described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The term "coupled" may be used herein with respect to elements, such as nodes, integrated circuit elements, and the like, to mean electrically coupled, which may include an ohmic coupling, a capacitive coupling, and/or an inductive coupling. The term "coupled" refers to the connection between the elements. Two coupled elements may be able to exchange electrical energy with each other, e.g., thereby influencing their operation, state or voltage. An element coupled between two other elements may include that the two other element may exchange electrical energy via the element coupled between the two other elements. For example, an electrical current exchanged between the two other elements may flow through the element coupled between the two other elements, e.g., causing a voltage drop over the element coupled between the two other elements. The electric coupling may be configured for an efficient transfer of electric energy, e.g., having an efficiency above 50% or above 90%.

The term "connected" may be used herein with respect to elements, such as nodes, integrated circuit elements, and the like, to mean electrically connected, which may include a direct connection or an indirect connection, wherein an indirect connection may only include additional structures in the current path that do not influence the substantial functioning of the described circuit or device. The term "electrically conductively connected" that is used herein to describe an electrical connection between one or more terminals, nodes, regions, contacts, etc., may be understood as an electrically conductive connection (e.g. an ohmic connection) with, for example, ohmic behavior, e.g. provided by a metal or degenerate semiconductor in absence of p-n junctions in the current path. The term "electrically conductively connected" may be also referred to as "galvanically connected." The impedance of an ohmic connection may include a reactance (e.g. capacitance related and/or inductance related) less than resistance (ohmic) or substantially no reactance. Reactance and resistance are components of the impedance.

In the following, reference is made to various circuit components, such as switches or charge storages. Examples for circuit components may include a transistor (e.g. for implementing a switch), a resistor and a capacitor (e.g. for implementing a charge storage or a capacitive coupling). According to various aspects, the circuit components may be implemented according to various types of semiconductor technology, such as group IV semiconductor (e.g. silicon or germanium) based semiconductor technology, group III-V semiconductor (e.g. gallium arsenide) based semiconductor technology, group III semiconductor based semiconductor technology, group V semiconductor based semiconductor technology, ternary semiconductor compound based semiconductor technology, or semiconducting polymer based semiconductor technology, for example. According to various aspects, the circuit components may be integrated into a substrate to form an integrated circuit.

A switch refers to a circuit element that is operable to change the electrical connection between two terminals (also referred to as input/output terminals or I/O-terminals) of the switch as a function of a signal supplied to a control node of the switch. The electrical connection may be changed between a high-resistivity state (e.g., being substantially electrically isolating) and a low-resistivity state (e.g., being substantially ohmic). For example, a switch may be provided by a transistors as an example, wherein the gate of the transistor provides the control node and drain and source provide the I/O-terminals. It may be understood that the references made to a transistor may apply analogously to switches of other types or more complex switches, e.g., including more than one transistor.

In the following, reference is made to various voltages, among others such as Vth, VDD and VSS. Herein, Vth refers to the threshold voltage of a circuit component in a given semiconductor technology. The threshold voltage may be inherent to the circuit component, e.g. a field-effect transistor (FET). For example, the threshold voltage Vth of a FET is the minimum gate-to-source voltage that is needed to create a conducting path between source and drain of the FET. As example, multiple circuit components of the same type within the circuit (or within a functional group of the circuit) may be substantially identical in their threshold voltage. In this case, the threshold voltage may be indicated for a single circuit component of the circuit (or functional group), and may be understood as applying also to other circuit components of the same type (if present) in the circuit (or functional group).

Herein, VDD refers to the supply voltage in the given semiconductor technology, e.g. as supplied to the circuit. For example, VDD may be in the range between about 2 volt and 5 volts. VDD may be provided by a power source connected to an input of the respective circuit.

Among others, VSS refers to a base voltage in the given semiconductor technology. As example, VSS may be ground, but however, may also differ from ground. Optionally, one or more other base voltages may be used in the given semiconductor technology, e.g. differing from VSS. For a facilitated understanding, the value of VSS is normalized herein to be zero. Reference made herein to various voltages use VSS as reference. In this metric, VDD may be positive, that is VDD>VSS. For example, the indication of VDD=3.3 volts may be understood as corresponding to VDD−VSS=3.3 volts, e.g. regardless of whether VSS is equal to ground, zero or another value. Said differently, VSS refers to the reference voltage. For a facilitated understanding, a voltage differing from VSS (e.g. by VDD or more) is represented by a binary value 1 (or the state "high"); and a voltage being equal to VSS is represented by a binary value 0 (or the state "low").

Reference is made herein to a control circuit. The control circuit may be configured to provide one or more input voltages, or one or more control signals. For example, the control circuit may be configured to operate one or more switches of the circuits as described herein, control charging/discharging of one or more charge storages, and/or control one or more voltage levels within the circuits as described herein.

According to various aspects, it was realized that conventional inverters and charge pumps are manufactured in CMOS technology, thus including NMOS and PMOS transistors, which results in parasitic bipolar effects. In this context, it was realized that a charge pump initial transient behavior turns on a parasitic bipolar transistor of the conventional latch architecture, which may lead to malfunction of the charge pump, e.g., if the parasitic bipolar transistor is strong enough.

According to various aspects, an architecture for an inverter structure and a charge pump is provided, which has less or even no parasitic bipolar effect, which allows that the architecture (e.g., the charge pump) works properly. In contrast to a conventional CMOS architecture, the provided architecture includes only NMOS transistors to properly control the triple wells to avoid parasitic bipolar effects. For example, the triple well includes a bipolar isolating well, which avoids the parasitic bipolar transistor (e.g., coupling source/drain to the ground/substrate terminal (e.g., to VSS)).

FIG. 1 illustrates a latch structure 100 (also referred to as flip-flop circuitry) according to various aspects in a circuit diagram. The latch structure includes a pair of first transistors M1, M2. The pair includes a first transistor M1 (for a facilitated understanding also referred to as left latch transistor M1) and a further first transistor M2 (for a facilitated understanding also referred to as right latch transistor M2).

The pair of first transistors M1, M2 is cross-coupled with each other. The cross-coupled pair of first transistors M1, M2 includes that, for each transistor, the gate of the transistor is coupled to the drain/source terminal of the other transistor. For example, the gate of the left latch transistor M1 is electrically connected to the drain of the right latch transistor M2 and the gate of the right latch transistor M2 is electrically connected to the drain of the left latch transistor M1.

This achieves that left latch transistor M1 is controlled based on the actual resistivity state (e.g., high-resistivity state of low-resistivity state) of the right latch transistor M2 and vice versa.

One or more transistor (e.g., the left latch transistor M1 and/or the right latch transistor M2) of the circuits described herein may be provided by a triple well device, herein exemplarily represented by triple well transistors (also referred as to dnw-transistor), e.g. a deep n-well transistor as detailed further in the following. In the circuit diagrams, the dnw-transistor is represented by two facing diodes and a FET, wherein the two facing diodes are connected to the base of the FET. The references made to a dnw-transistor may in analogy apply to other types of triple well devices (e.g. including a bipolar isolating well), not being necessarily limited to a deep n-well providing the bipolar isolating well.

Figure 2:
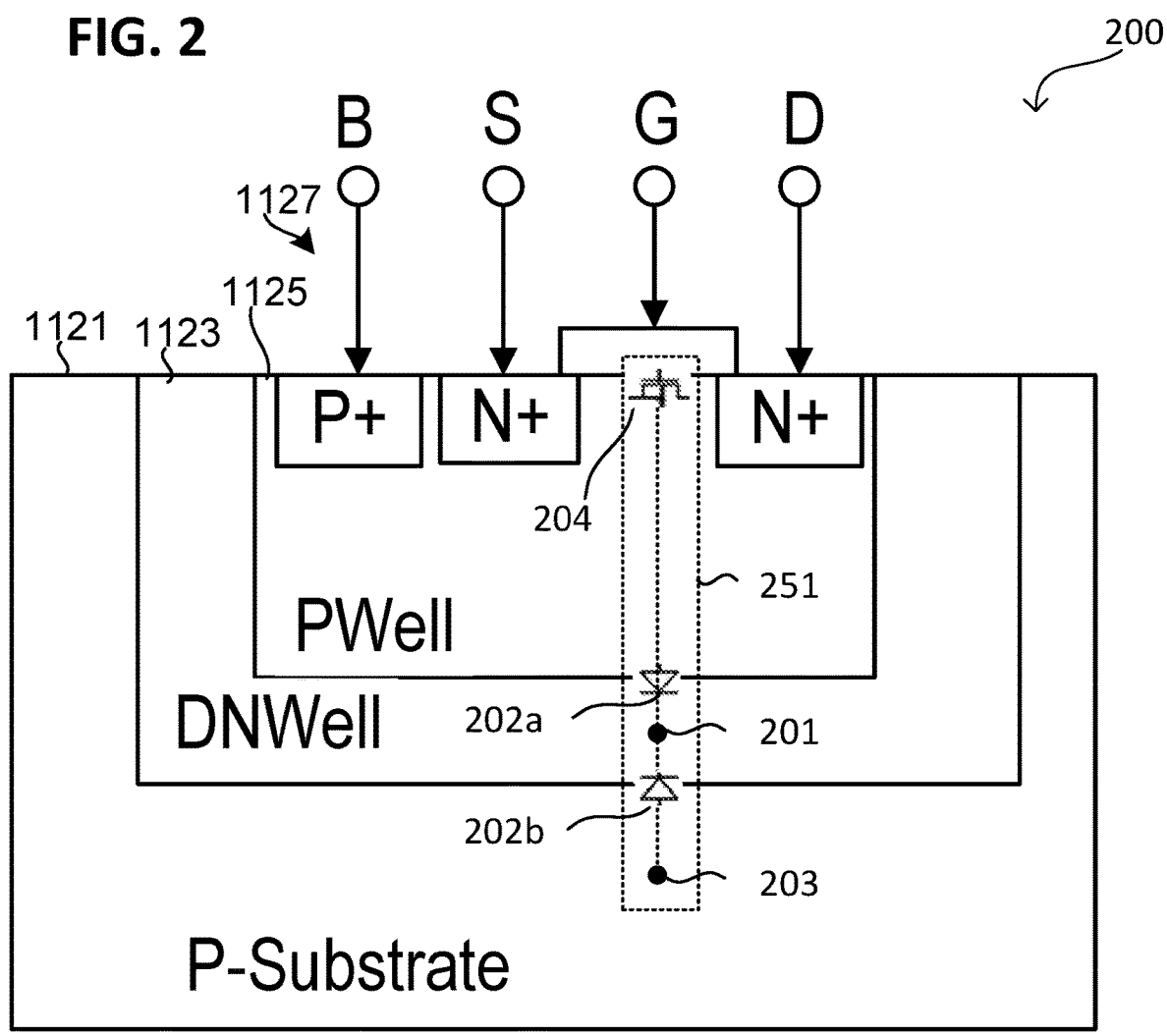
FIG. 2 shows a schematic view of a triple well transistor according to various aspects in a schematic layout diagram.

FIG. 2 illustrates a dnw-transistor as exemplarily representative of a triple well device 200 (also referred as to device in triple well configuration) according to various aspects in a schematic layout diagram and equivalent circuit diagram 251. The triple well device 200 may include multiple wells, including, for example, an outer well 1121 (e.g. provided by a substrate), an intermediate well 1123 (also referred as to first well or bipolar isolating well) embedded in the outer well, and an inner well 1125 (also referred as to second well) embedded in the intermediate well 1123. The triple well device 200 may further include a semiconductor device 1127 embedded in the inner well 1125, e.g. a FET 1127 embedded in the inner well 1125. Via the semiconducting junctions formed with the intermediate well 1123, the outer well 1121 (e.g. bulk-well) and the inner well 1125 are electrically isolated from each other, which is also referred as to bipolar isolation. In other words, the intermediate well 1123 is a bipolar isolating semiconductor well 1123.

The semiconductor device 1127 may include at least two terminals and one or more semiconductor junctions connecting the at least two terminals with each other. The multiple wells may include or be formed from a doped semiconductor material, e.g. doped silicon. The doping type of the intermediate well 1123 (e.g. n-type) may be opposite to the doping type of the outer well 1121 and inner well 1125 (e.g. p-type). In the circuit diagrams, the triple well configuration is represented by two diodes 202a, 202b, each of which represents the interface between two adjacent wells, in which the semiconductor device 1127 is embedded.

In the following, the more specific dnw-transistor is outlined as an example for a triple well transistor. The references made to the dnw-transistor may in analogy apply to other types of triple well devices 200.

As an example, the dnw-transistor includes a p-substrate (p doped substrate) as outer well 1121, a deep n-doped well as intermediate well 1123, and p-doped well as inner well 1125. The semiconductor device 1127 may include a field-effect transistor 204 (FET) embedded in the inner well 1125. The semiconductor device 1127 may be an n-channel FET (also referred as to NMOS transistor) as example. The terminals of the FET 1127 are: base (B), source (S), drain (D) and gate (G).

The intermediate well 1123 may be contacted by an intermediate well terminal 201, e.g. for applying an auxiliary voltage to the intermediate well 1123 via intermediate well terminal 201. The intermediate well 1123 may be, for example, connected to the source and/or the base, as outlined by the following circuit diagrams. The outer well 1121 may be contacted by an outer well terminal 203, e.g. for applying a base voltage (e.g. VSS) to the outer well 1121 via the outer well terminal 203. The inner well 1125 may be optionally contacted by an inner well terminal B (here the base), e.g. for applying the auxiliary voltage or a further auxiliary voltage to the inner well 1125 via inner well terminal B. The inner well 1125 may be, for example, connected to the source and/or the base, as outlined by the following circuit diagrams.

Figure 3:
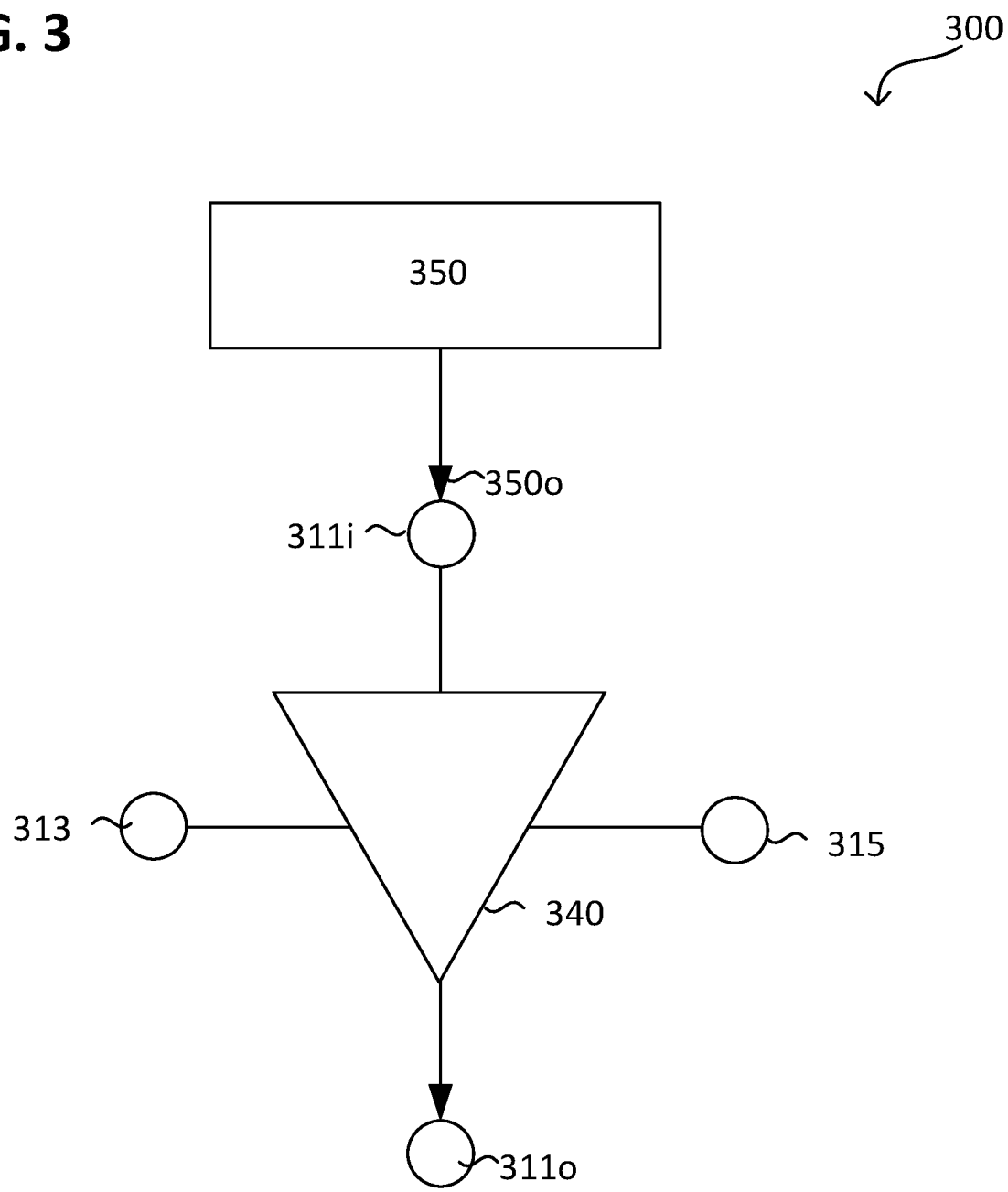
FIG. 3, FIG. 4 and FIG. 5 show each an inverter structure according to various aspects in a circuit diagram.

FIG. 3 illustrates an inverter structure 300 according to various aspects in a circuit diagram. Generally, the inverter structure 300 includes one or more inverter circuits 340 (also referred to as not-gate circuits) and multiple nodes connected to each inverter circuit 340. Examples of the multiple nodes include one or more first nodes 313 (also referred to as first reference node), one or more second nodes 315 (also referred to as second reference node) and/or one or more third nodes. Examples of the one or more third nodes include one or more control nodes 311i and an intermediate node 311o.

Generally, the inverter structure 300 may be operated in various operation schemas, e.g., according to an inverter operation schema or a pumping operation schema, by supplying a control signal 350o to the control node 311i. Optionally the inverter structure 300 may include a control circuit 350 configured to provide the control signal 350o to the control node 311i.

According to the inverter operation schema, the first node(s) 313 and second node(s) 315 are operated as current source, wherein the intermediate node 3110 is operated as current output. According to the inverter operation schema, each inverter circuit 340 is configured to output an output signal to the intermediate node 3110 based on the control signal 350o received by the control node 311i. For example, the inverter circuit 340 may include one or more switches that are controlled by the control signal 350o. The output signal may be based on a first reference voltage, when the control signal 350o fulfils a criterion (e.g., being below a threshold), and otherwise based on a second reference voltage. For example, the output signal may be amplitude-inverted to the control signal 350o, when the first reference voltage is more than the second reference voltage. For example, the first reference voltage may be supplied to the inverter circuit 340 via the first reference node 313. For example, the second reference voltage may be supplied to the inverter circuit 340 via the second reference node 315.

According to the pumping operation schema, the first node(s) 313 is/are operated as current source, wherein the second node(s) 315 is/are operated as current output. The intermediate node 3110 (in this context also referred to as charge storage node) receives current from the first node(s) 313 and supplies current to the second node(s) 315 in an alternating order. The more electrical charges are stored by the intermediate node 311o, the more current may be transferred from the first node(s) 313 to the second node(s) 315. The capability of storing electrical charges may be increased by a capacitor as detailed later.

The pumping operation schema allows to implement a latch-type charge pump (also referred to as Pelliconi charge pump or as charge pump of the latch type) using the inverter structure 300, which is described later in detail.

Figure 4:
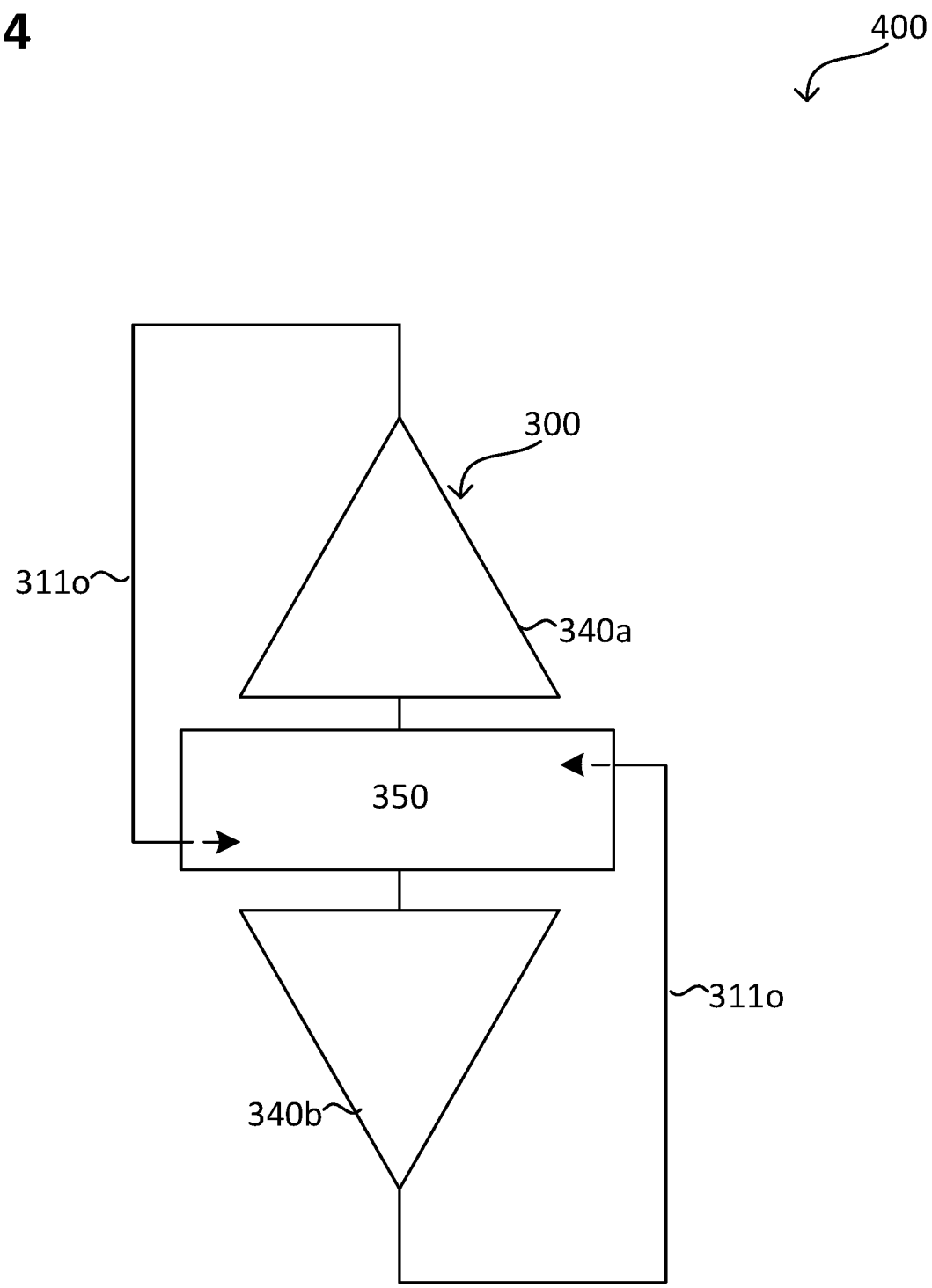

FIG. 4 illustrates an inverter structure 300 according to various aspects 400 in a circuit diagram. The inverter structure 300 may include two inverter circuits 340a, 340b, which are also referred to as left inverter circuit 340a and right inverter circuit 340b for a facilitated understanding. The control signal may be supplied by the control circuit 350 to each of the two inverter circuits 340, e.g., based on the voltage of the intermediate node 3110 of each of the two inverter circuits 340. For example, the control signal may be supplied to the left inverter circuit 340a based on the voltage of the intermediate node 3110 of the right inverter circuit 340b. For example, the control signal may be supplied to the right inverter circuit 340b based on the voltage of the intermediate node 3110 of the left inverter circuit 340a. This allows for a coupled operation of the two inverter circuits 340a, 340b. Illustratively, a feedback loop is provided by the control circuit 350, such that each of the two inverter circuits 340a, 340b is controlled based on a result of its own state.

Figure 5:
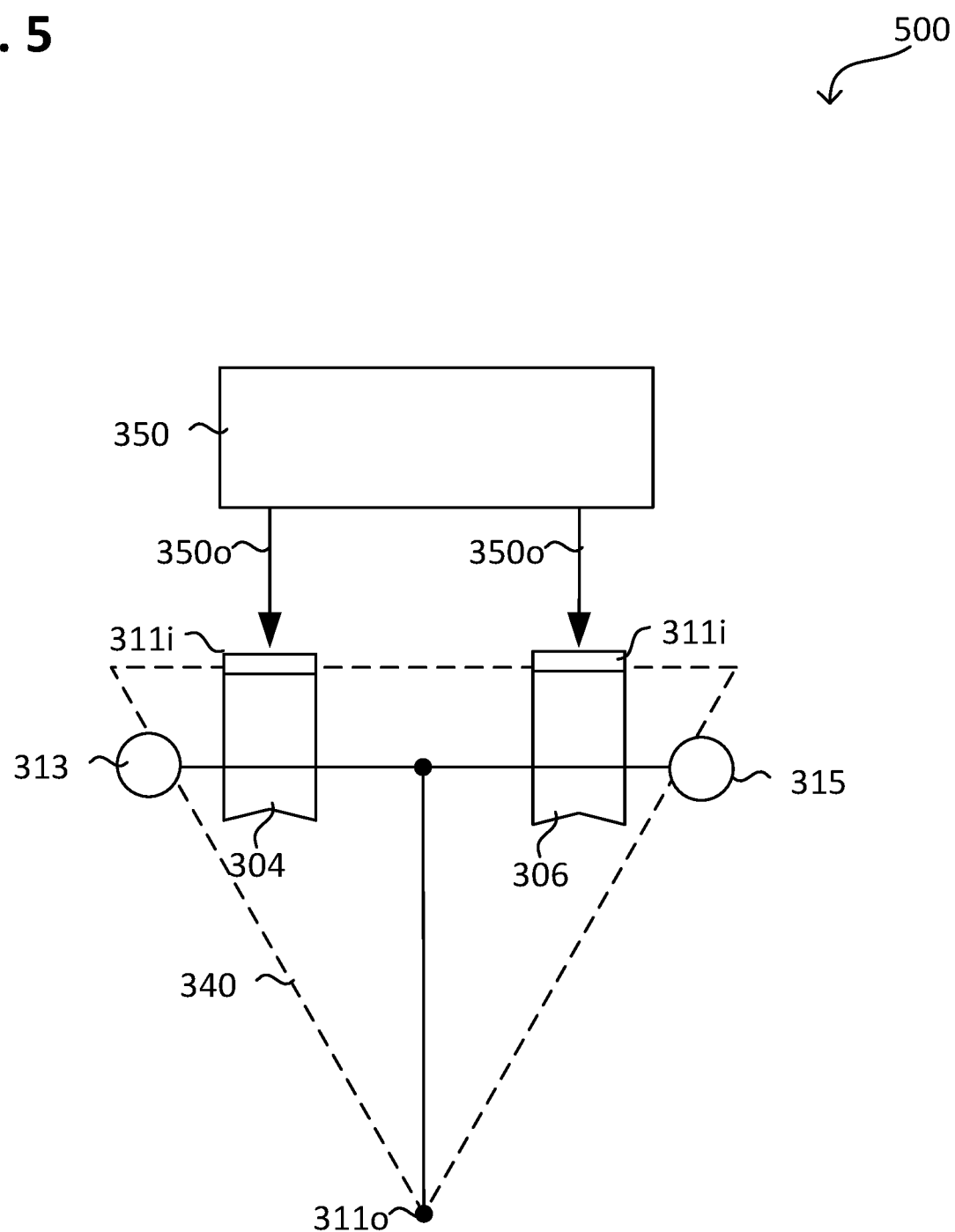

FIG. 5 illustrates an inverter structure 300 according to various aspects 500 in a circuit diagram. The inverter circuit 340 may include a first switch 304 (e.g., including or formed from a first transistor 304) coupling the first node 313 with the intermediate node 311o. The inverter circuit 340 may include a second switch 306 (e.g., including or formed from a second transistor 306) coupling the second node 315 with the intermediate node 311o.

Each of the first switch 304 and second switch 306 may be controlled by the control circuit 350.

As an example, the first transistor 304 and the second transistor 306 may be of the same type of channel doping. For example, the first transistor 304 may be a first n-channel MOSFET (also referred to as NMOS transistor) and the second transistor 306 may be a second n-channel MOSFET. It may be understood that the MOSFET is an exemplary representative for the FET. The references made to the MOSFET may, in analogy, also apply to other types of FET.

Additionally or alternatively, the first transistor 304 and the second transistor 306 may be a dnw-transistor. For example, the first transistor 304 may be a first dnw-transistor and the second transistor 306 may be a second dnw-transistor. For example, one or more switches (e.g. each switch) of the inverter structure 300 may be provided by a triple well device, herein exemplarily represented by a dnw-transistor, e.g. a deep n-well transistor.

The aspects described with reference to the inverter structure 300 may apply analogously to the charge pump (e.g., including the inverter structure 300) as described in the following.

Figure 6:
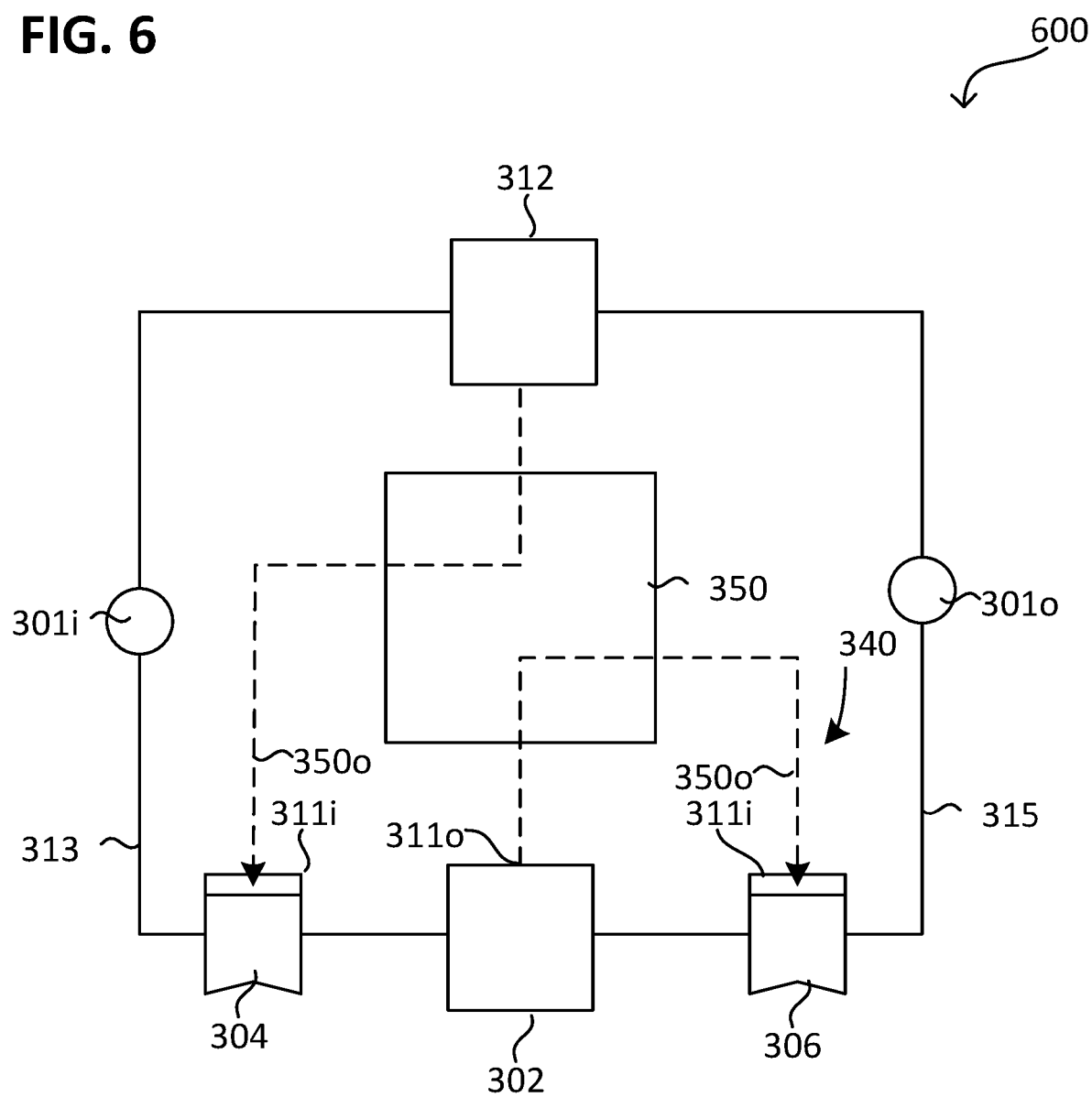
FIG. 6 and FIG. 7 show each a schematic view of a latch-type charge pump according to various aspects in a circuit diagram.

FIG. 6 illustrates a latch-type charge pump 600 (also referred to as flip-flop charge pump) according to various aspects in a circuit diagram. The charge pump 600 may include an input node 301$i$ and an output node 301$o$. In general, each latch-type charge pump may include one or more charge storages, e.g., at least one charge storage at each intermediate node 311$o$. A charge storage may include a capacity, e.g. provided by one or more capacitors of the charge pump 600.

A charge storage (e.g., the first charge storage 302 and/or the second charge storage 312) may be charged, such that the charge storage absorbs electrical energy (e.g., by forming an electrical field). Charging the charge storage includes that the charge storage is supplied with an electrical current to transfer charges to the charge storage. A charge storage (e.g., the first charge storage 302 and/or the second charge storage 312) may be discharged, such that the charge storage releases electrical energy (e.g., by depleting the electrical field). Discharging the charge storage includes that the charge storage supplies an electrical current to transfer charges from the charge storage. Altering the voltage of one or more control signals in the charge pump 600 causes charging and discharging the charge storage as described later in detail.

The charge pump 600 as depicted includes a first charge storage 302 and a second charge storage 312 coupled in parallel to each other. The first charge storage 302 may be coupled between the input node 301$i$ and an output node 301$o$. The second charge storage 312 may be coupled between the input node 301$i$ and the output node 301$o$.

The charge pump 600 may further include the first switch 304 and the second switch 306. The first charge storage 302 may be coupled between the first switch 304 and the second switch 306. The first switch 304 may be coupled between the input node 301$i$ and the first charge storage 302; and/or the second switch 306 may be coupled between the output node 301$o$ and the first charge storage 302.

The charge pump 600 may further include the control circuit 350. The control circuit 350 may be configured to operate one or more circuit elements of the charge pump 600, such as one or more switches and/or one or more charge storages and the like. For example, the control circuit 350 may be configured to control the first switch 304 based on a state of the second charge storage 312. For example, the control circuit 350 may be configured to control the second switch 306 based on a state of the first charge storage 302. This allows discharging the first charge storage 302 properly and at the right point of time.

For example, the control circuit 350 may be configured to supply a first control signal 350$o$ to the control node (e.g., the gate) of the first switch 304, wherein the first control signal 350$o$ is based on the state of the second charge storage 312. Additionally or alternatively, the control circuit 350 may be configured to supply a second control signal 350$o$ to the control node (e.g., the gate) of the second switch 306, wherein the second control signal 350$o$ is based on the state of the first charge storage 302. Said more generally, the control signals 350$o$ supplied to the first switch 304 and to the second switch 306 may differ from each other, e.g., by their time dependency.

The state of a charge storage (e.g., the first charge storage 302 and/or the second charge storage 312) may represent the electrical energy stored by the charge storage. For example, the state of a charge storage may be the charging state of the charge storage. The state of a charge storage may be sensed by sensing a quantity of the charge storage. Examples of the quantity of the charge storage may include: the magnitude of the electric field of the charge storage, the amount of charges absorbed/released by the charge storage, and/or a voltage of (e.g., input to or output by) the charge storage, or the phase of a pumping sequence, in which the charge storage is. In the following, reference is made to the voltage of the charge storage as exemplarily representative for the state of the charge storage. The references made to the voltage of the charge storage may apply in analogy to another quantity of the charge storage representing the state of the charge storage.

The control circuit 350 may be configured to convert the voltage of the respective charge storage 302, 312 (e.g., of the charge storage node 311$o$) into the control signal 350$o$ supplied the respective switch 304, 306. Examples of the state of a charge storage may include a first state (e.g., charged) and a second state (e.g., discharged). The control circuit 350 may be configured to provide the control signal supplied the respective switch 304, 306 as a function of the change between the first state and the second state.

Illustratively, the control circuit 350 implements that the control of the switches 304, 306 differs in the underlying quantity that is input to the control mechanism. This facilitates the control of the switches 304, 306 and provides a more reliable control of the switches 304, 306. For example, switching the first switch 304 is based on charging/discharging of the second charge storage 312, and switching the second switch 306 is based on charging/discharging the first charge storage 302. This difference in the underlying quantity that is input to the control mechanism inhibits that the latch-type charge pump 600 enters a self-stabilized condition, in which charge pump 600 gets stuck.

According to various aspects, one or more switches (e.g. each switch) of the charge pump 400 may be provided by a triple well device, e.g., a dnw-transistor. The references made to the dnw-transistor may, in analogy, apply to other types of devices including a bipolar isolating well, not being necessarily limited to a deep n-well providing the bipolar isolating well.

Figure 7:
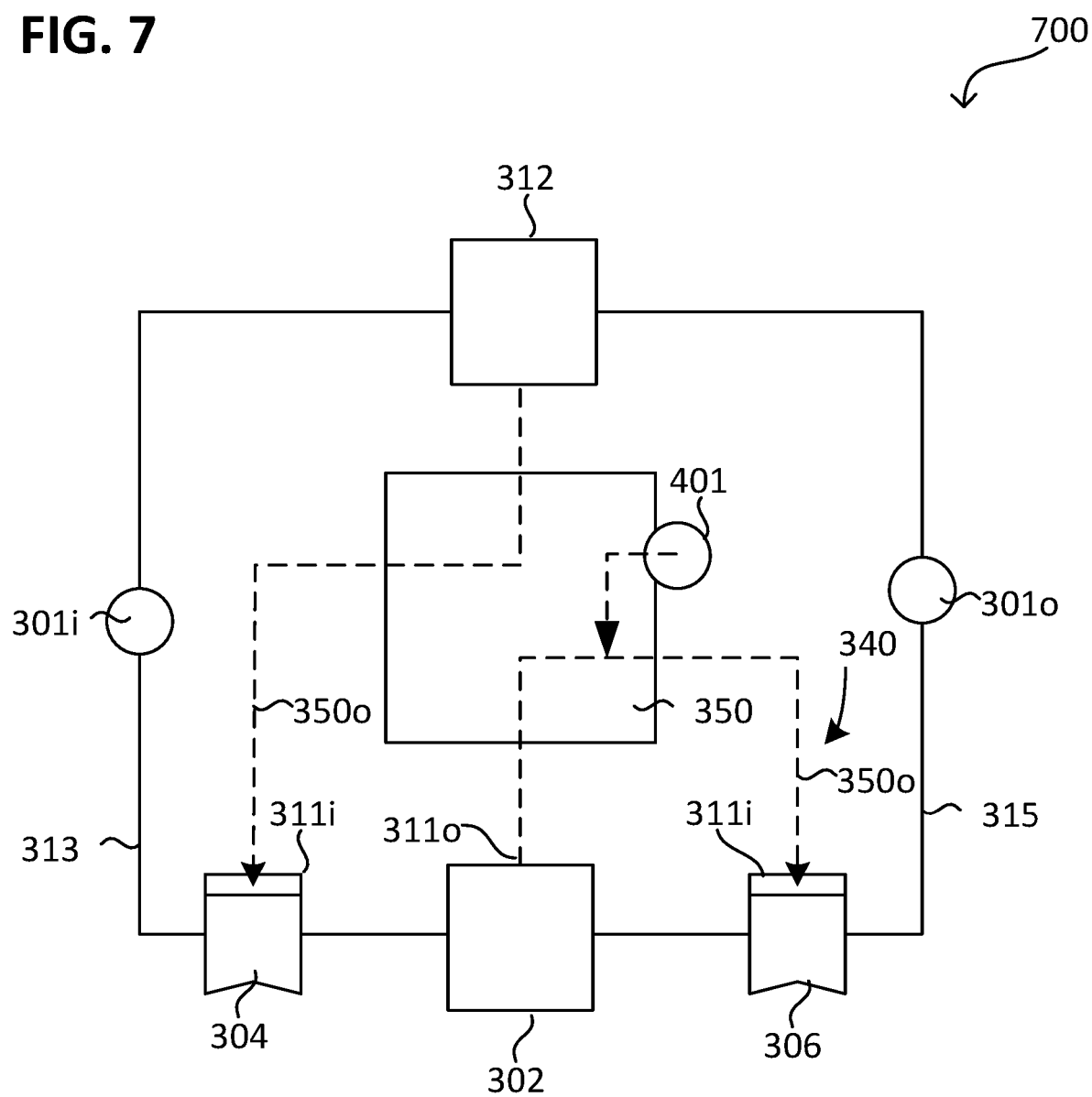

FIG. 7 illustrates a latch-type charge pump 600 (also referred to as flip-flop charge pump) according to various aspects 700 in a circuit diagram, in which the control circuit 350 includes one or more controller nodes 401. The control circuit 350 may be configured to control the second switch 306 further based on a control signal (also referred to as a switch control signal) at the controller node 401. This allows for a more precise control of the second switch 306. Exemplarily implementations of the switch control signal are described later in detail.

Figure 8:
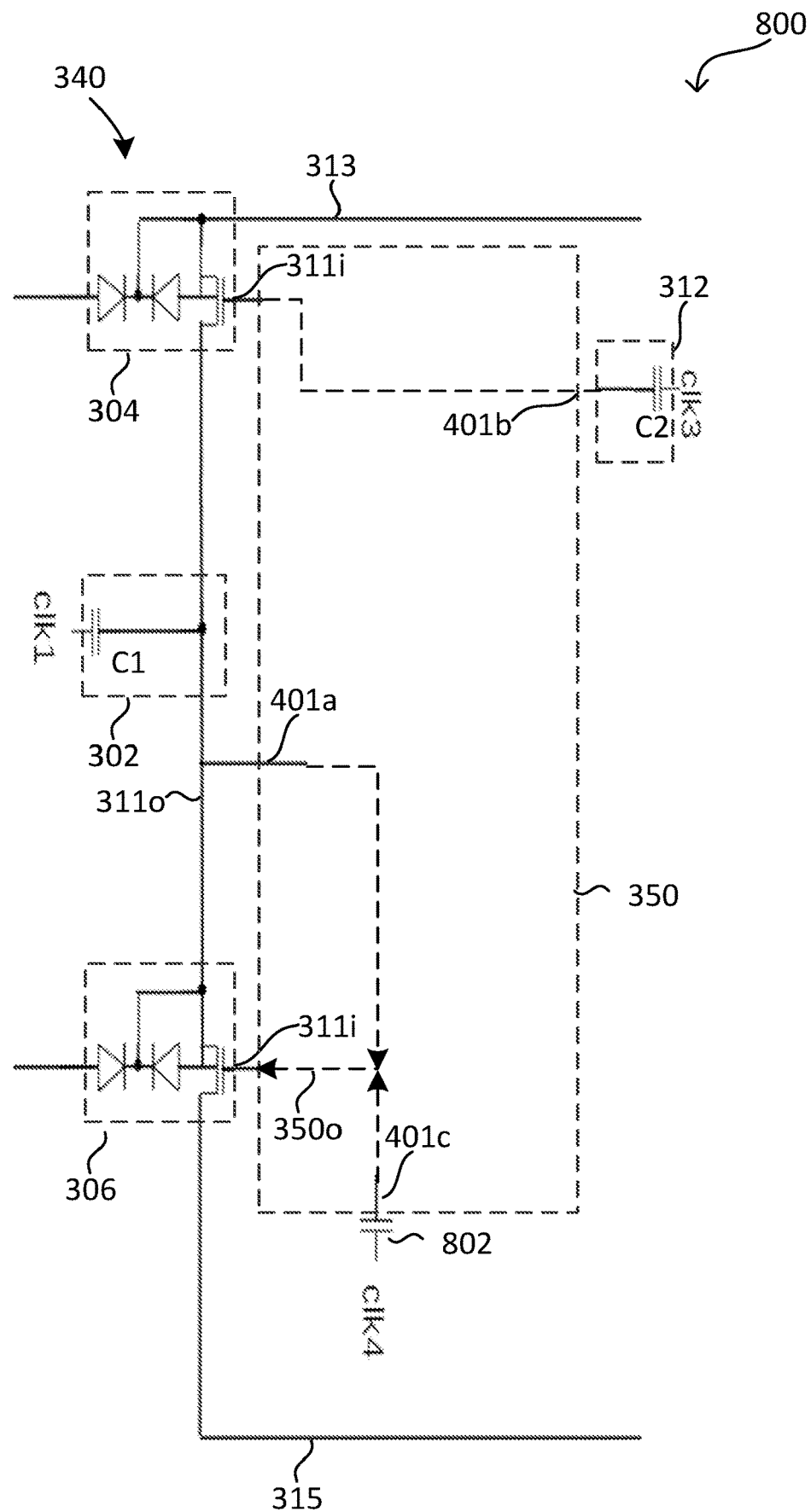
FIG. 8 shows a schematic view of an inverter structure according to various aspects in a circuit diagram.

FIG. 8 illustrates an inverter structure 300 as it may be used in a latch-type charge pump 600 (also referred to as flip-flop charge pump) according to various aspects 800 in a circuit diagram. It may be understood that the inverter structure 300 does not necessarily have to be used in the charge pump 600.

In the following, each switch of the charge pump 600 is represented by a dnw-transistor. The references made with respect to dnw-transistors may be understood analogously to apply to other types of switches, e.g., including more than one transistor. For example, the gate of a transistor may provide the control node of the respective switch. The references made with respect to the gates of a transistors may be understood to apply analogously to the control nodes of switches.

When used in the charge pump 600, each charge storage of the charge pump 600 may include or be formed from a capacitor. The references made with respect to capacitors may be understood analogously to other types of charge storages, e.g., including more than one capacitor. For example, a first capacitor C1 may (but does not necessarily need to) provide the first charge storage 302 of the charge pump 600. For example, a second capacitor C2 may (but does not necessarily need to) provide the second charge storage 304 of the charge pump 600.

As such, a first dnw-transistor transistor 304 and a second dnw-transistor 306 may be connected by the intermediate node 3110 of the inverter circuit 340 (in context to a charge pump 600 also referred to as first charge storage node N1). The intermediate node 3110 of the inverter circuit 340 is connected to the first capacitor C1, to the control circuit 350, to the drain of the first dnw-transistor 304 and to the source of the second dnw-transistor 306. The first reference node 313 may be connected to the intermediate well of the first dnw-transistor 304. The intermediate node 3110 may be connected to the intermediate well of the second dnw-transistor 306.

A first control signal clk1 is capacitively supplied to a first controller node 401a of the control circuit 350 via the first capacitor C1. In context of the charge pump 600, the first control signal clk1 controls charging and discharging of the first charge storage 302. As such, the state of the first charge storage 302 (e.g., the first capacitor C1) is a function of the first control signal clk1.

Analogously, a second control signal clk3 is capacitively supplied to a second controller node 401b of the control circuit 350 via the second capacitor 312. In context of the charge pump 600, the second control signal clk3 controls charging and discharging of the second charge storage 312. As such, the state of the second charge storage 312 (e.g., the second capacitor C2) is a function of the second control signal clk3.

Further, a third control signal clk4 (also referred to as a switch control signal) is capacitively supplied to a third controller node 401c of the control circuit 350 via a third capacitor 802. As such, the state of the third capacitor 802 is a function of the third control signal clk4. The third control signal clk4 allows controlling the second switch 306 independently from the state of the second charge storage 312.

The control circuit 350 may be configured to control the first switch 304 based on the state of the second charge storage 312 (e.g., of the second capacitor C2) independently from the state of the first charge storage 302. The control circuit 350 may be configured to control the second switch 306 based on the state of the first charge storage 302 (e.g., of the first capacitor C1) independently from the state of the second charge storage 312 and/or based on the state of the third capacitor 802.

As example, the control signals clk1, clk3 and clk4 may be supplied to the control circuit 350 by a signal generator. It may be understood that the signal generator may be also provided as part of the control circuit 350 or may be provided externally from the control circuit 350.

Generally, the control signals clk1, clk3 and clk4 may differ from each other, e.g., by their time dependency. Examples of the control signals clk1, clk3 and clk4 are detailed later.

Figure 9:
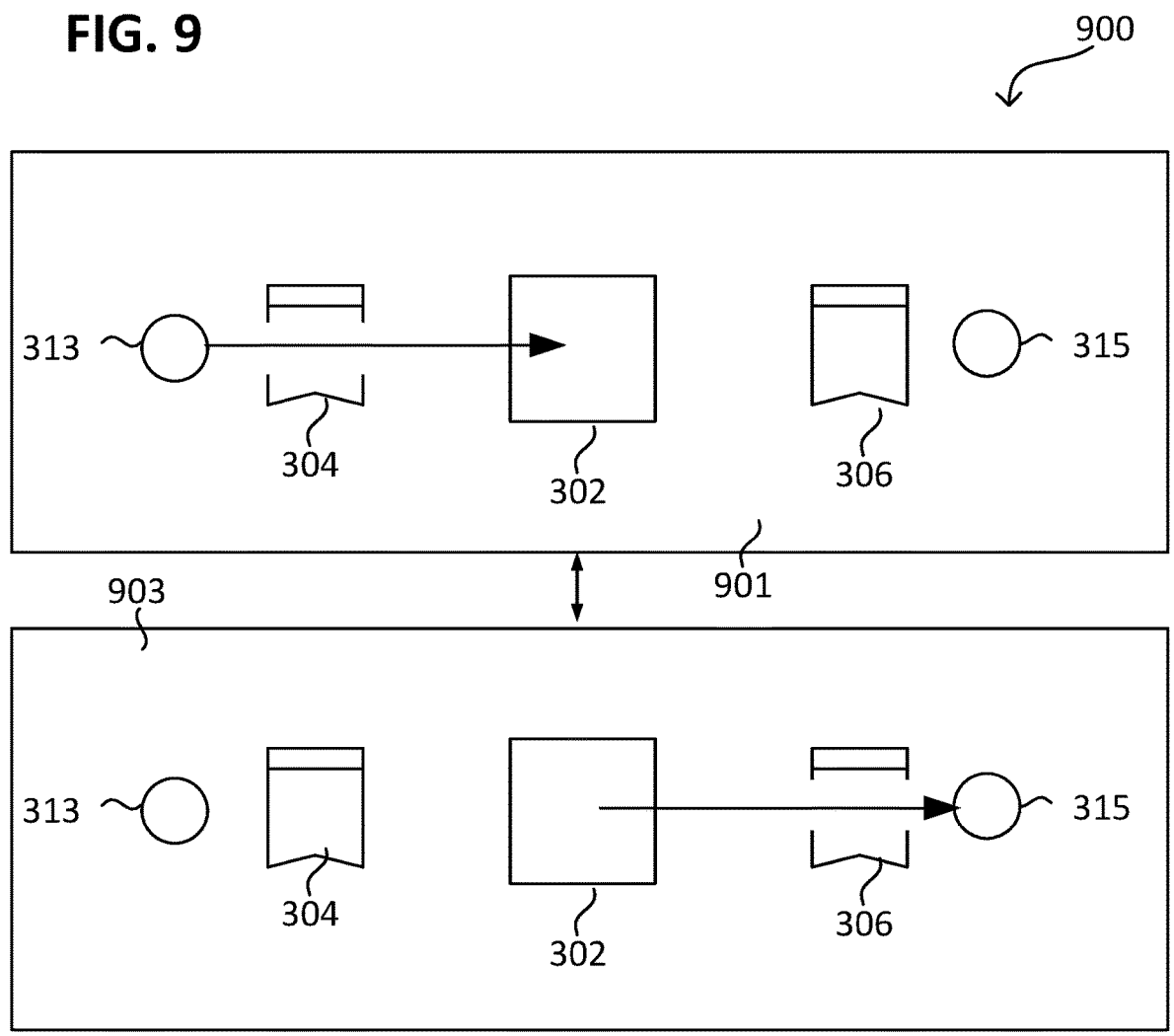
FIG. 9 shows a schematic view of a pumping operation schema for operating the latch-type charge pump according to various aspects in a flow diagram.

FIG. 9 illustrates a pumping operation schema 900 for operating the latch-type charge pump 600 according to various aspects in a flow diagram. When the inverter structure is part of a charge pump, the inverter structure may be operated according to the pumping operation schema.

The pumping operation schema may include a first phase 901, in which the first switch 304 is switched on (and/or off), while the second switch 306 is off. This achieves a transfer of charges (also referred to as current flow) from the input node 301i of the charge pump 600, which may be provided by the first reference node 313 of the inverter structure 300, of the charge pump, to the first charge storage 302.

The pumping operation schema may include a second phase 903, in which the second switch 306 is switched on and off, while the first switch 304 is off. This achieves a transfer of charges (also referred to as current flow) from the first charge storage 302 to the output node 301o of the charge pump 600, e.g., provided by the second reference node 315 of the inverter structure 300.

The pumping operation schema may include one or more pumping sequences, wherein each pumping sequence includes one first phase 901 and thereafter one second phase 903. For example, the first phase 901 and second phase 903 may be applied in alternating order, e.g., sequentially.

In the following, an exemplarily time dependency of the respective control signals is detailed.

Figure 10:
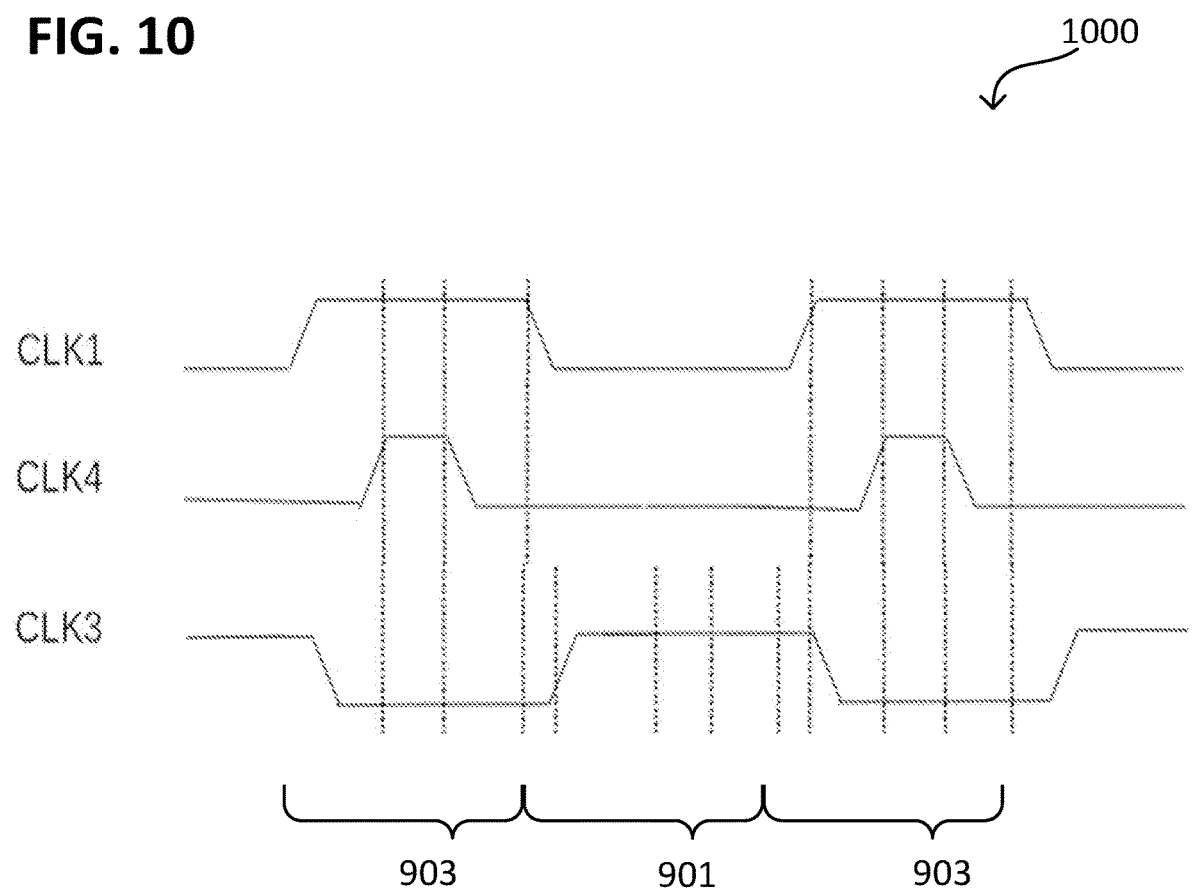
FIG. 10 shows a schematic view of various control signals of the control circuit according to various aspects in a diagram.

FIG. 10 illustrates various control signals of the control circuit 350 according to various aspects in a diagram 1000. The control signals may be supplied according to the pumping operation schema detailed above.

For a facilitated understanding, the control signals are depicted and detailed herein as binary signals. A binary signal may change between two voltages, which are also exemplarily referred as "high" (referring to the higher voltage) and "low" (referring to the lower voltage). For example, a voltage of the binary signal may be increased by changing from low to high. For example, a voltage of the binary signal may be decreased by changing from high to low. It may be understood that the exemplarily states, namely "high" and "low", may also have another voltage relation. It may also be understood that the control signals may also have more than two states.

The second phase 903 may include that the first control signal clk1 is switched to high, thereafter the second control signal clk3 is switched to low, and thereafter the third control signal clk4 is switched to high and back to low. This achieves appropriate switching of the first and second switches 304, 306. For example, the first switch 304 may be off in the first phase 901, wherein the second switch 306 may be switched on only as long as the third control signal clk4 is high.

The first phase 901 may include that the first control signal clk1 is switched to low, thereafter the second control signal clk3 is switched to high, while the third control signal clk4 maintains low. This achieves appropriate switching of the first and second switches 304, 306. For example, the second switch 306 may be off in the first phase 901, wherein the first switch 304 may be switched on only as long as the second control signal clk3 is high.

It may be understood that other implementations of the pumping operation schema may include more or less than three control signals, e.g., for operating the switches 304, 306. It may be understood that other implementations of the pumping operation schema may include another time dependency of the control signals, e.g., being switched parallel to each other, rather than sequentially.

Figure 11:
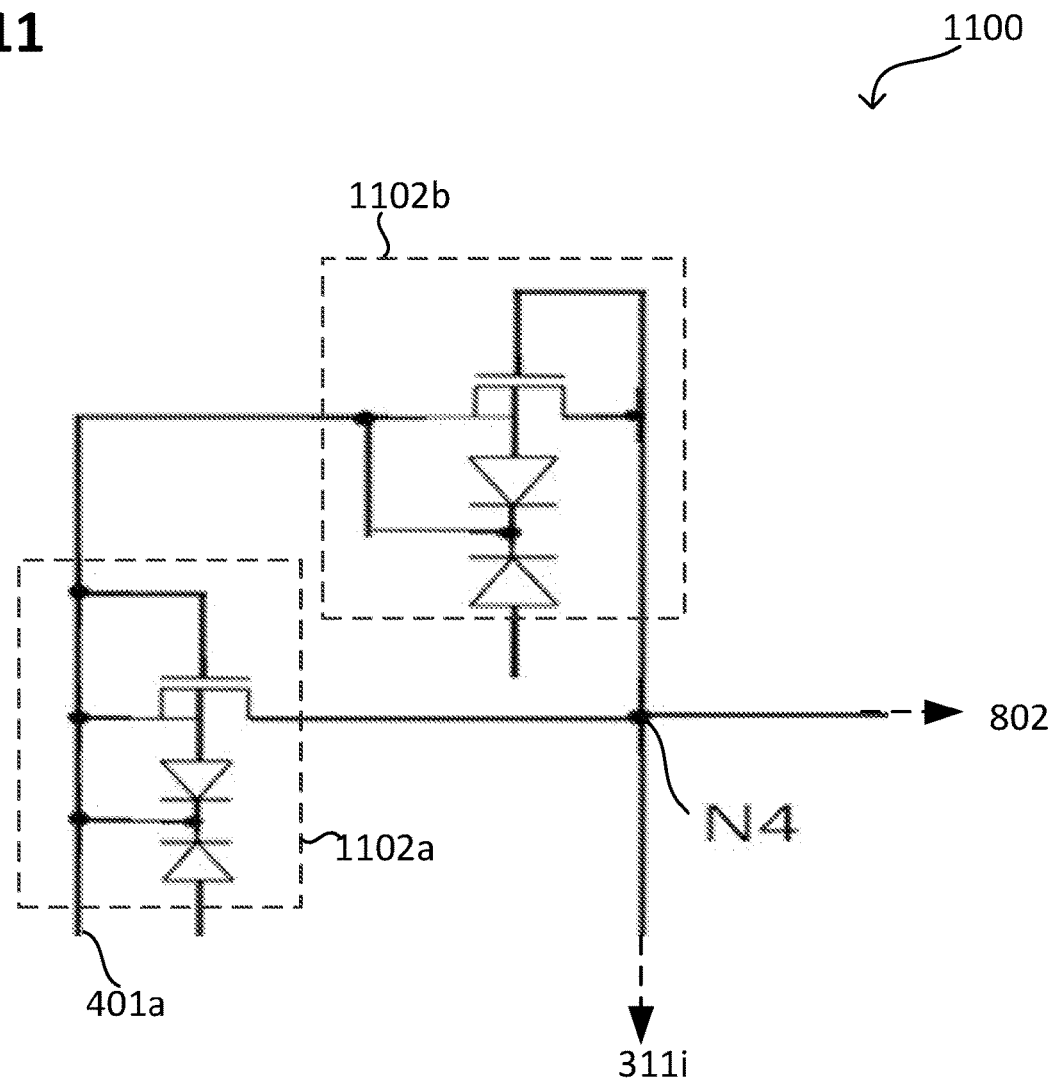
FIG. 11 shows a schematic view of a control circuit according to various aspects in a detailed circuit diagram.

FIG. 11 illustrates a control circuit 350 according to various aspects 1100 in a detailed circuit diagram. The control circuit 350 may include one or more diode-connected third dnw-transistors 1102a, 1102b, e.g., each of which providing a control switch 1102a, 1102b. The one or more diode-connected third dnw-transistors 1102a, 1102b may include a first control dnw-transistor 1102a and/or a second control dnw-transistor 1102b.

The third controller node 401c (also referred to as N4 node) may connect the control node 311i with the third capacitor 802. The first control dnw-transistor 1102a may connect the N4 node with the first controller node 401a. Additionally or alternatively, the second control dnw-transistor 1102b may connect the N4 node with the first controller node 401a.

If present, the first control dnw-transistor 1102a and the second control dnw-transistor 1102b may be coupled in parallel to each other and/or may differ from each other in their direction (also referred to as anti-parallel direction), they are connected with the N4 node. An example of the anti-parallel direction may include that the N4 node may be connected to a source of the second control dnw-transistor 1102b and to a drain of the first control dnw-transistor 1102a. An example of the anti-parallel direction may include that the connection between the second control dnw-transistor 1102b and the first control dnw-transistor 1102a may be a drain-to-source-connection. An example of the anti-parallel direction may include that the gate of the first control dnw-transistor 1102a is connected to a drain of the second control dnw-transistor 1102b. An example of the anti-parallel direction may include that the N4 node is connected to the gate of the second control dnw-transistor 1102b. An example of the anti-parallel direction may include that the second control dnw-transistor 1102b connects the N4 node with the gate of the first control dnw-transistor 1102a.

The pumping operation schema may include the second phase 903, in which the first control dnw-transistor 1102a is switched from on to off and back to on. The second control dnw-transistor 1102b may be off while the first control dnw-transistor 1102a is on, and may be weakly on while the first control dnw-transistor 1102a is off.

The first controller node 401a may be connected to the intermediate well of the first control dnw-transistor 1102a. The N4 node may be connected to the intermediate well of the second control dnw-transistor transistor 1102b. This achieves a proper biasing of the bipolar isolated well.

Figure 12:
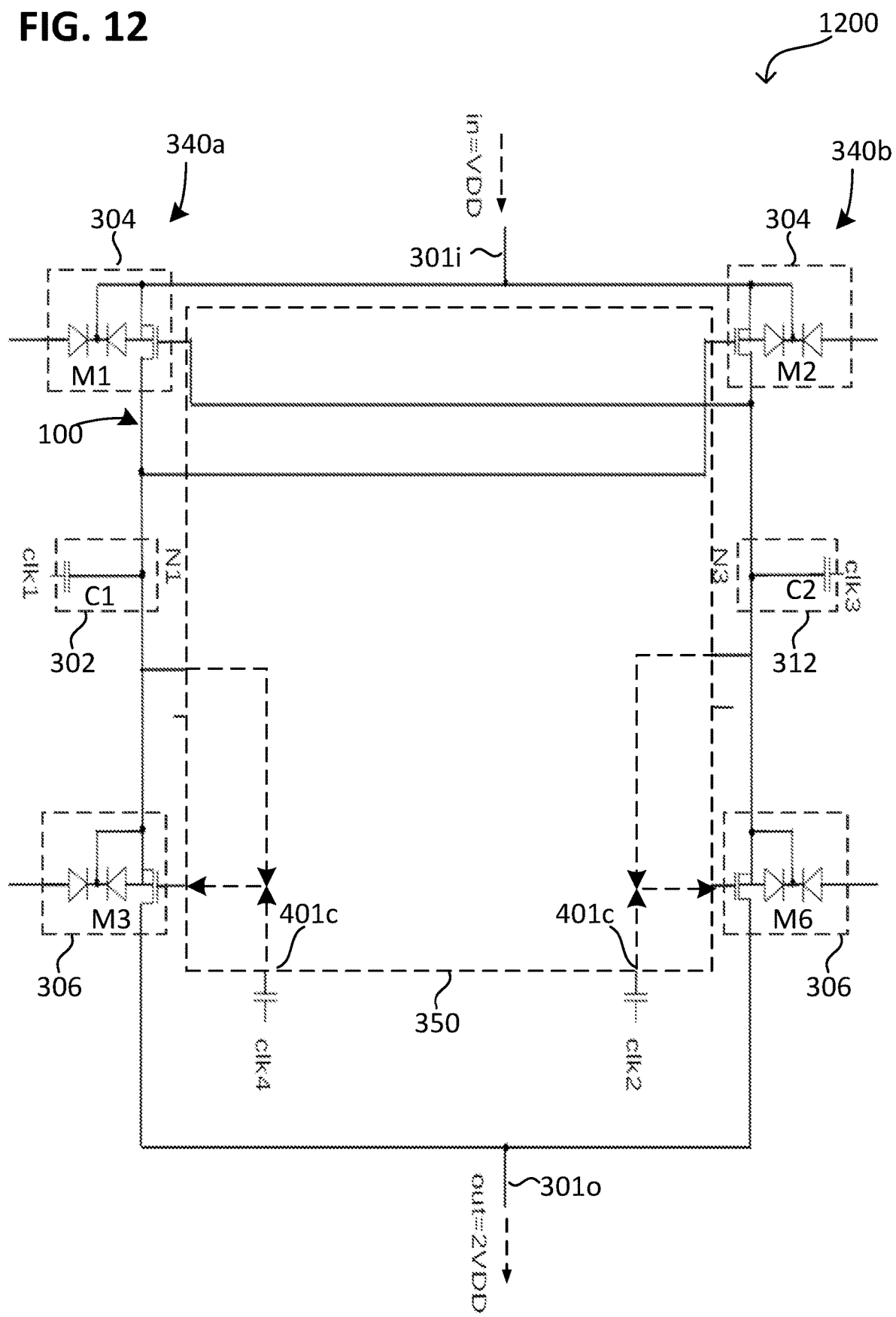
FIG. 12 and FIG. 13 show each a schematic view of a latch-type charge pump according to various aspects in a circuit diagram.

FIG. 12 illustrates the latch-type charge pump 600 according to various aspects 1200 in a circuit diagram. The latch-type charge pump 600 may include two inverter circuits 340 similar to aspects 400, which are also referred for a facilitated understanding to as left right inverter circuit 340a and right inverter circuit 340b.

The charge pump 600 may include the latch structure 100 including the pair of first transistors M1, M2. Each transistor of the pair of first transistors M1, M2 provides a first switch 304 of one of the inverter circuits 340a, 340b. Said more generally, the latch-type charge pump 600 includes a pair of first switches 304 that are cross-coupled with each other, e.g., by the control circuit 350.

The charge pump 600 may include a pair of second transistors M3, M6. Each transistor of the pair of second transistors M3, M6 provides a second switch 306 of one of the inverter circuits 340a, 340b. Said more generally, the latch-type charge pump 600 includes a pair of second switches 306.

The control circuit 350 may be configured to control the pair of second switches 306 in a push-pull configuration and independently from the latch structure 100. For example, the control circuit 350 may operate the pair of second switches 306 independently to the pair of first switches 304. For example, the control circuit 350 may be configured to apply an individual voltage to each control node of the pair of second switches 306 (also referred to as first control nodes) and to each control node of the pair of first switches 304 (also referred to as second control nodes). For example, the voltage at the each of the first control nodes may differ from the voltage at the each of the second control nodes. The latch structure may be configured to provide the voltages at the first control nodes in push-pull configuration (e.g., by push-pull control signals 350o). The control circuit 350 may be configured to provide the voltages at the second control nodes in push-pull configuration (e.g., by push-pull control signals 350o).

The input node 301i may be connected to the intermediate well of the first switch 304 of the left inverter circuit 340a and/or to the intermediate well of the first switch 304 of the right inverter circuit 340b. The first charge storage 302 (e.g., node N1) may be connected to the intermediate well of the second switch 306 of the left inverter circuit 340a. The second charge storage 312 (e.g., node N3) may be connected to the intermediate well of the second switch 306 of the right inverter circuit 340b.

Figure 13:
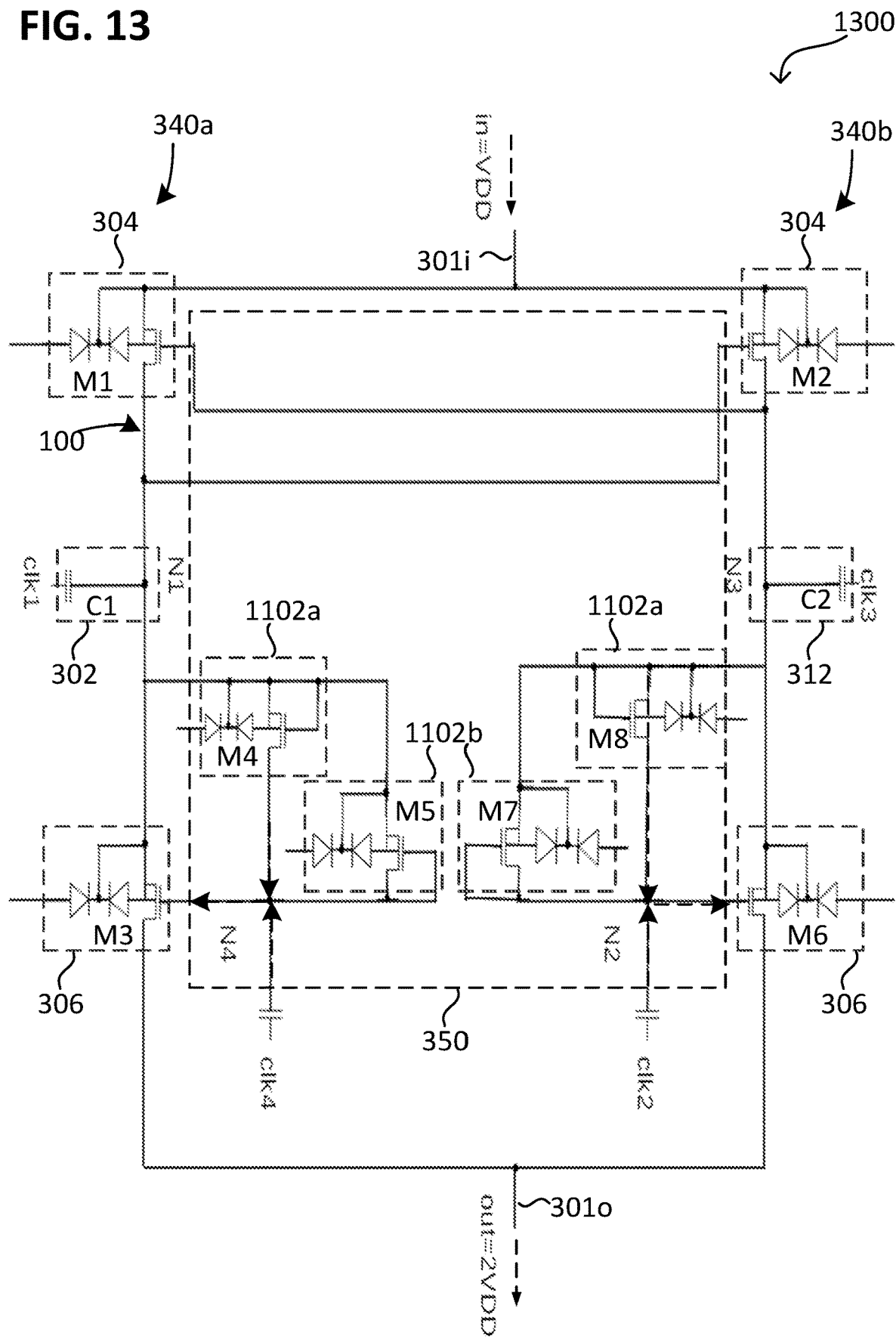

FIG. 13 illustrates the latch-type charge pump 600 according to various aspects 1300 in a circuit diagram.

The third controller node 401c connected to the left inverter circuit 340a (e.g., transistor M3) is referred to as N4 node. The third controller node 401c connected to the right inverter circuit 340b (e.g., transistor M6) is referred to as N2 node. The voltages of the N4 node and the N2 node may differ from each other, e.g., by their time dependency.

The intermediate node 3110 of the left inverter circuit 340a (e.g., connected to the first capacitor C1) is referred to as N1 node (in context to a charge pump 1100 also referred to as first charge storage node N1). The intermediate node 3110 of the right inverter circuit 340b (e.g., connected to the second capacitor C2) is referred to as N3 node (in context to a charge pump 1100 also referred to as second charge storage node N3).

VDD refers to the supply voltage at the input node 301i. The latch-type charge pump 600 may be configured to provide 2·VDD or more at the output node 301o.

According to aspects 1300, the control circuit 350 includes four diode connected transistors M4, M5, M7, M8. The control circuit 350 may be configured to individually control the second switches 306 (e.g., transistors M3 and M6). This allows that each of the second switches 306 includes or is formed from an NMOS transistor M3, M6, which reduces the parasitic bipolar effect present due to conventional PMOS transistors.

The first control signal clk1 is supplied to the first charge storage 302 and thus capacitively supplied to node N1. The second control signal clk3 is supplied to the second charge storage 312 and thus capacitively supplied to node N3. The third control signal clk4 is capacitively supplied to node N4 and a fourth control signal clk2 is capacitively supplied to node N2. As example, the control signals clk1, clk2, clk3 and clk4 may be supplied to the control circuit 350 by a signal generator. It may be understood that the signal generator may be provided as part of the control circuit 350 or may be external from the control circuit 350.

Generally, the control signals clk1, clk2, clk3 and clk4 may differ from each other, e.g., by their time dependency. Examples of the control signals clk1, clk2, clk3 and clk4 are detailed later.

Figure 14:
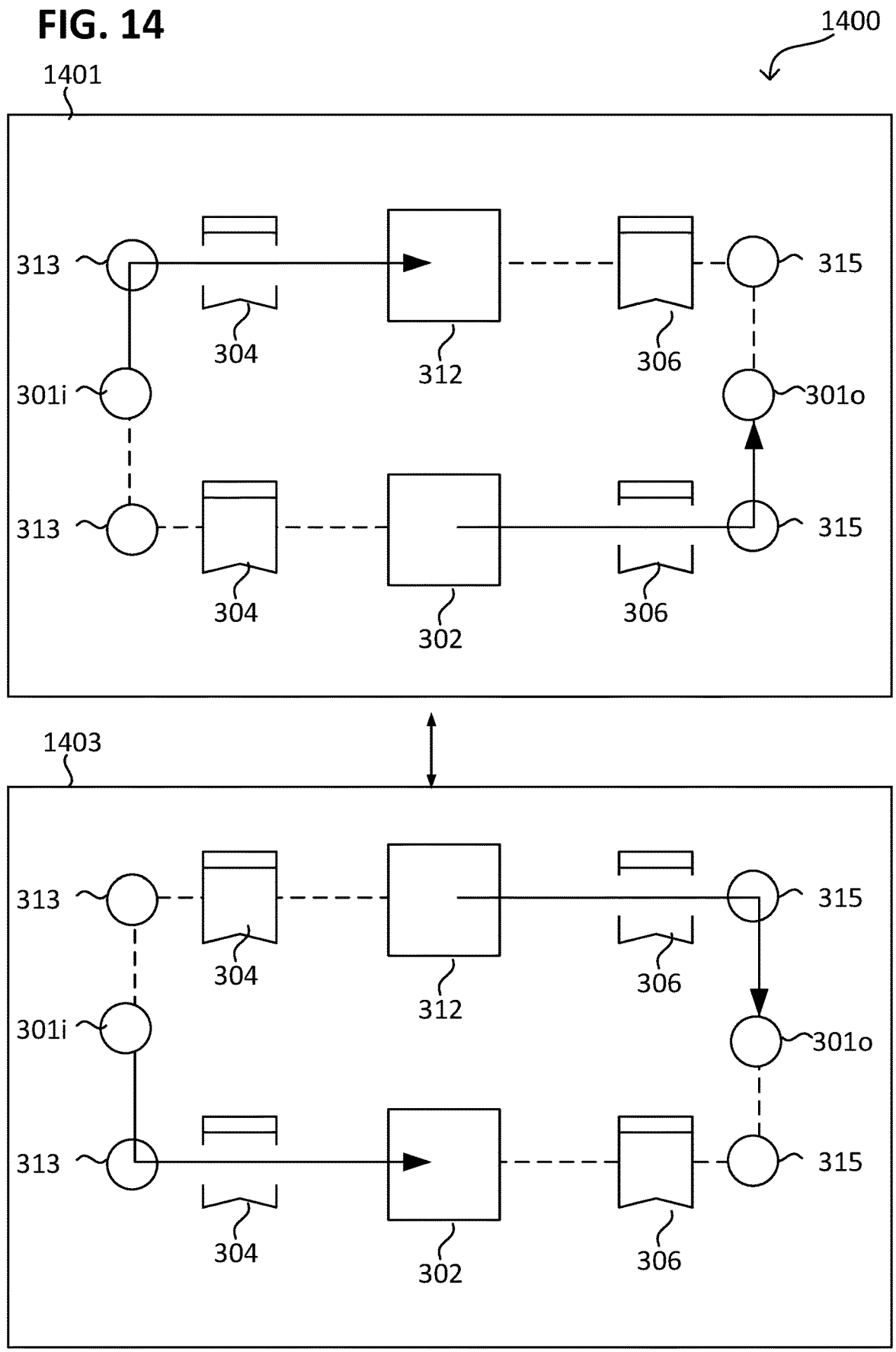
FIG. 14 shows a schematic view of a pumping operation schema for operating the latch-type charge pump according to various aspects in a flow diagram.

FIG. 14 illustrates a pumping operation schema 1400 for operating the latch-type charge pump 600 according to various aspects in a flow diagram. The pumping operation schema 1400 may be similar as pumping operation schema 900, with the difference that the inverter circuits of the charge pump 600 differ in their current phases of the pumping operation schema 900. For example, the left inverter circuit of the charge pump 600 is in the first phase 901 while the right inverter circuit of the charge pump 600 is in the second phase 903 and vice versa.

The pumping operation schema 1400 may include a first phase 1401, in which the second charge storage 312 is charged (also referred to as brought into a charged state) via the input node 301*i* and the first charge storage 302 is discharged (also referred to as brought into a discharged state) via the output node 301*o*. This achieves a transfer of charges (also referred to as current flow) from the input node 301*i* to the second charge storage 312 and from the first charge storage 302 to the output node 301*o*.

The pumping operation schema may include a second phase 1403, in which the first charge storage 302 is charged (also referred to as brought into a charged state) via the input node 301*i* and the second charge storage 312 is discharged (also referred to as brought into a discharged state) via the output node 301*o*. This achieves a transfer of charges (also referred to as current flow) from the input node 301*i* to the first charge storage 302 and from the second charge storage 312 to the output node 301*o*.

The pumping operation schema may include one or more pumping sequences 1400, wherein each pumping sequence 1400 includes one first phase 1401 and thereafter one second phase 1403. For example, the first phase 1401 and second phase 1403 may be applied in alternating order, e.g., sequentially.

In the following, an exemplarily time dependency of the control signals is detailed.

FIG. 15 illustrates various control signals supplied to the control circuit 350 according to various aspects 1500 in a diagram. The amplitude of each of the first control signal clk1, the second control signal clk3, the third control signal clk4, and the fourth control signal clk2 is about VDD.

The control signals clk1 and clk3 supplied to the charge storages may be in push-pull configuration. For example, the first control signal clk1 is high (e.g., at VDD) when the second control signal clk3 is low (e.g., at VSS). Analogously, the first control signal clk1 is low (e.g., at VSS) when the second control signal clk3 is high (e.g., at VDD).

The third control signal clk4 may be switched to high and back to low while the first control signal clk1 is high. The fourth control signal clk2 may be switched to high and back to low while the second control signal clk3 is high.

As result, in the first phase 901, the voltage of node N2 (e.g., being at 3·VDD) may be temporally higher than the voltage at node N3 (e.g., being at 2·VDD). Analogously, in the second phase 903, the voltage of node N4 (e.g., being at 3·VDD) may be temporally higher than the voltage at node N1 (e.g., being at 2·VDD).

According to aspects 1500, the control circuit 350 includes four diode connected transistors M4, M5, M7, M8 and each of the second switches 306 includes an NMOS transistor M3, M6. When the first control signal clk1 is switched to high, the voltage at node N1 node is changed to 2·VDD, which switches on the diode connected transistor M4 and charges the node N4 to a voltage of 2·VDD-Vth. Node N4 is switched to 3·VDD-Vth, when the third control signal clk4 is high. As result, an output voltage (out) of 2·VDD is provided at the output node 301o via transistor M3. When the first control signal clk1 is low, transistor M3 is off as the gate of transistor M3 is at a voltage of VDD+Vth, which is supplied by the diode connected transistor M5 to the gate of transistor M3. When the first control signal clk1 is low and the second control signal clk3 is high, the output voltage (out) of 2·VDD is provided at the output node 301o via transistor M6.

As a resulting aspect, a beneficial configuration is provided, in which each transistor of the charge pump is stressed to a maximum voltage that is equal to VDD or less than VDD.

According to various aspects, the charge pump 600 may be used to generate a positive power supply provided at the output node 301o.

According to various aspects, triple well devices are well controlled to inhibit parasitic bipolar effects.

According to various aspects, triple well devices are stressed to a maximum of VDD.

According to various aspects, only NMOS triple well devices are used to provide the charge pump 600 and/or the inverter structure 300.

It may be understood that multiple charge pumps 600 may be connected to each other in series (to provide more than 2·VDD) and/or in parallel (to provide more electrical power). If connected in series, each charge pump 600 described herein provides for one pump stage, of which each pump stage increases the output voltage by VDD.

In the following, various examples are provided with reference to the aspects described above.

Example 1 is a (e.g., latch-type) charge pump, including: an input node and an output node; a first charge storage and a second charge storage coupled in parallel to each other, a first switch coupled to the input node and a second switch coupled to the output node, wherein the first charge storage couples the first switch with the second switch; and a control circuit configured to control the first switch based on a state of the second charge storage, and to control the second switch based on a state of the first charge storage (e.g., independently from the state of the second charge storage).

Example 2 is the (e.g., latch-type) charge pump of example 1, wherein the control circuit is configured to supply a control signal based on the state of the first charge storage to the control node of the second switch (e.g., a control terminal, e.g., transistor gate, of the second switch) maneuver wherein, for example, the time dependency and/or voltage of the control signal is based on the state of the first charge storage.

Example 3 is the (e.g., latch-type) charge pump of example 1 or 2, wherein the control circuit includes a controller node; and is configured to control the second switch based on a control signal received at the controller node, the control signal being, for example, a binary signal, the control signal being, for example, capacitively coupled to the controller node.

Example 4 is the (e.g., latch-type) charge pump of one of examples 1 to 3, wherein the control circuit includes one or more control switches coupling the controller node to the first charge storage and/or to the second switch; and/or coupling the first charge storage to the second switch (e.g., the control terminal, e.g., transistor gate, of the second switch), wherein, for example, each control switch of the one or more control switches includes of the is formed from a third (e.g., diode connected) transistor.

Example 5 is the (e.g., latch-type) charge pump of example 4, wherein a control node (e.g., control terminal, e.g., transistor gate) of a first control switch of the one or more control switches is coupled to the controller node; and/or wherein a control node (e.g., control terminal, e.g., transistor gate) of a second control switch of the one or more control switches is coupled to the first charge storage.

Example 6 is the (e.g., latch-type) charge pump of one of examples 1 to 5, wherein a transistor gate of the one or more control switches is coupled to a transistor gate of the second switch; and/or wherein a transistor gate of the one or more control switches is coupled to the first charge storage.

Example 7 is the (e.g., latch-type) charge pump of one of examples 1 to 6, further including: a further first switch coupled to the input node and a further second switch coupled to the output node, wherein the second charge storage couples the further first switch with the further second switch; and wherein the control circuit is configured to control the further first switch based on a state of the first charge storage, and to control the further second switch based on a state of the second charge storage (e.g., independently from the state of the first charge storage).

Example 8 is the (e.g., latch-type) charge pump of example 7, wherein the control circuit includes a further controller node; and is configured to control the further second switch based on a further control signal received at the further controller node, the further control signal being, for example, a binary signal and/or differing from the control signal; the further control signal being, for example, capacitively coupled to the further controller node.

Example 9 is the (e.g., latch-type) charge pump of example 8, wherein the control circuit includes one or more further control switches coupling the further controller node to the second charge storage and/or to the further second switch.

Example 10 is the (e.g., latch-type) charge pump of example 9, wherein a control node (e.g., control terminal, e.g., transistor gate) of a further first control switch of the one or more further control switches is coupled to the further controller node; and/or wherein a further control node (e.g., control terminal, e.g., transistor gate) of a further second control switch of the one or more further control switches is coupled to the second charge storage.

Example 11 is the (e.g., latch-type) charge pump of one of examples 1 to 10, wherein the first switch includes or is made from a first transistor; and wherein the second switch includes or is made from a second transistor, wherein the first transistor and the second transistor are of the same type of channel doping (e.g., p-doped).

Example 12 is a (e.g., latch-type) charge pump (e.g., of one of examples 1 to 11), including: an input node and an output node; a latch structure including a pair of first switches coupled to each other by the input node; a pair of second switches coupled to each other by the output node, each second switch coupling the latch structure with the output node, a control circuit configured to control the pair of second switches in push-pull configuration and independently from the latch structure.

Example 13 is the (e.g., latch-type) charge pump of one of examples 1 to 12, wherein one or more first switches of the pair of first switches includes or are made from one or more first transistors; and/or wherein one or more second switch of the pair of second switches includes or are made from one or more second transistors.

Example 14 is a (e.g., latch-type) charge pump (e.g., of one of examples 1 to 13), including: an input node and an output node; a first charge storage and a second charge storage coupled in parallel to each other, a first transistor coupled to the input node and a second transistor coupled to the output node, wherein the first charge storage couples the first transistor with the second transistor; and wherein the first transistor and the second transistor are of the same type of channel doping (the doping type of their channel, e.g., p-doped) and/or embedded in the same type of well doping (the doping type of the well, e.g., p-doped).

Example 15 is the (e.g., latch-type) charge pump of example 14, further including: a control circuit configured to control the first transistor based on a state of the second charge storage, and to control the second transistor based on a state of the first charge storage.

Example 16 is the (e.g., latch-type) charge pump of example 15, wherein the control circuit: includes a controller node; and is configured to control the second transistor based on a control signal received at the controller node; the control signal being, for example, a binary signal; the control signal being, for example, capacitively coupled to the controller node.

Example 17 is the (e.g., latch-type) charge pump of example 16, wherein the control circuit includes one or more control switches coupling the controller node to the first charge storage.

Example 18 is the (e.g., latch-type) charge pump of example 17, wherein a control node (e.g., control terminal, e.g., transistor gate) of a first control switch of the one or more control switches is coupled to the controller node; and/or wherein a control node (e.g., control terminal, e.g., transistor gate) of a second control switch of the one or more control switches is coupled to the first charge storage.

Example 19 is the (e.g., latch-type) charge pump of one of examples 14 to 18, further including: a further first transistor coupled to the input node and a further second transistor coupled to the output node, wherein the second charge storage couples the further first transistor with the further second transistor; and wherein the further first transistor and the further second transistor are of the same type of channel doping (the doping type of their channel, e.g., p-doped) and/or embedded in the same type of well doping (the doping type of the well, e.g., p-doped).

Example 20 is the (e.g., latch-type) charge pump of example 19, wherein the control circuit is configured to control the further first transistor based on a state of the first charge storage, and to control the further second transistor based on a state of the second charge storage.

Example 21 is the (e.g., latch-type) charge pump of example 20, wherein the control circuit includes a further controller node; and is configured to control the further second transistor based on a further control signal received at the further controller node; the further control signal being, for example, a binary signal and/or differing from the control signal; the further control signal being, for example, capacitively coupled to the further controller node.

Example 22 is the (e.g., latch-type) charge pump of example 21, wherein the control circuit includes one or more further control switches coupling the further controller node to the second charge storage.

Example 23 is the (e.g., latch-type) charge pump of example 22, wherein a control node (e.g., control terminal, e.g., transistor gate) of a further first control switch of the one or more further control switches is coupled to the further controller node; and/or wherein a control node (e.g., control terminal, e.g., transistor gate) of a further second control switch of the one or more further control switches is coupled to the second charge storage.

Example 24 is the (e.g., latch-type) charge pump of one of examples 1 to 23, wherein each first switch (e.g., first switch and/or further first switch) of the charge pump includes or is formed from a first transistor.

Example 25 is the (e.g., latch-type) charge pump of one of examples 1 to 24, wherein each first transistor (e.g., first transistor and/or further first transistor) of the charge pump is a triple well transistor, each triple well transistor optionally including a bipolar isolated well (e.g., being n-doped).

Example 26 is the (e.g., latch-type) charge pump of example 25, wherein the bipolar isolated well of each first transistor is electrically conductively connected to a source terminal of the first transistor and/or to the input node.

Example 27 is the (e.g., latch-type) charge pump of one of examples 1 to 26, wherein each second switch (e.g., second switch and/or further second switch) of the charge pump includes or is formed from a second transistor.

Example 28 is the (e.g., latch-type) charge pump of one of examples 1 to 27, wherein each second transistor (e.g., second transistor and/or further second transistor) of the charge pump is a triple well transistor, each triple well transistor optionally including a bipolar isolated well (e.g., being n-doped).

Example 29 is the (e.g., latch-type) charge pump of example 28, wherein the bipolar isolated well of each second transistor is electrically conductively connected to a source terminal of the second transistor and/or to a charge storage of the latch-type charge pump.

Example 30 is the (e.g., latch-type) charge pump of one of examples 1 to 29, wherein each first transistor (e.g., first transistor and/or further first transistor) and each second transistor (e.g., second transistor and/or further second transistor) of the charge pump are of the same type of channel doping and/or embedded in the same type of well doping.

Example 31 is the (e.g., latch-type) charge pump of one of examples 1 to 30, wherein the channel doping is an n-type doping.

Example 32 is the (e.g., latch-type) charge pump of one of examples 1 to 31, wherein the channel doping is a p-type doping and/or wherein the well doping is a p-type doping.

Example 33 is an inverter structure, including: a first node, a second node and a third node; a first transistor coupling the first node with the third node; a second transistor coupling the third node with the second node; wherein the first transistor and the second transistor are of the same type of channel doping (the doping type of their channel, e.g., p-doped) and/or embedded in the same type of well doping (the doping type of the well, e.g., p-doped); a control circuit configured to control the first transistor and the second transistor, such that the second node alternates between being connected to the first node and the second node; wherein the control circuit includes one or more diode-connected third transistors for controlling the second transistor, wherein, for example, each of the one or more diode-connected third transistors is of the type of channel doping (the doping type of their channel, e.g., p-doped) and/or embedded in the type of well doping (the doping type of the well, e.g., p-doped); wherein, for example, each of the one or more diode-connected third transistors is connected to a gate of the second transistor.

Example 34 is the inverter structure of example 33, wherein the control circuit is configured to control the first transistor and the second transistor, such that the third node is electrically connected to the first node for a first time period and electrically connected to the second node for a second time period, wherein the second time period and the first time period differ from each other, e.g., by their time dependency.

Example 35 is the inverter structure of example 33 or 34, wherein the channel doping is a p-type doping and/or wherein the well doping is a p-type doping.

Example 36 is the inverter structure of one of examples 33 to 35, wherein the first transistor and the one or more diode-connected third transistors are of the same type of channel doping.

Example 37 is the inverter structure of one of examples 33 to 36, wherein the one or more diode-connected third transistors couple a gate of the second transistor with the third node.

Example 38 is the inverter structure of one of examples 33 to 37, wherein the one or more diode-connected third transistors include two diode-connected third transistors coupled in parallel to each other.

Example 39 is the inverter structure of one of examples 33 to 38, wherein the control circuit is configured to supply a first control signal to a gate of the first transistor and a second control signal to a gate of second first transistor, wherein the first control signal and the second control signal differ from each other, e.g., by their time dependency.

Example 40 is a latch-type charge pump (e.g., of one of examples 1 to 32) including the inverter structure of one of examples 33 to 39.

In example 41 the control circuit of one of examples 1 to 40 is configured to control the second switch (e.g., the second transistor) by supplying a first control signal, which is based on the state of the first charge storage, to a transistor gate of the second switch (e.g., to a gate of the second transistor).

In example 42 the control circuit of one of examples 1 to 41 is configured to control the further second switch (e.g., the further second transistor) by supplying a further first control signal, which is based on the state of the second charge storage, to a transistor gate of the further second switch (e.g., to a gate of the further second transistor).

In example 43 the control circuit of one of examples 1 to 42 is configured to control the first switch (e.g., the first transistor) by supplying a second control signal, which is based on the state of the second charge storage, to a transistor gate of the first switch (e.g., to a gate of the first transistor).

In example 44 the control circuit of one of examples 1 to 43 is configured to control the further first switch (e.g., the further first transistor) by supplying a further second control signal, which is based on the state of the first charge storage, to a transistor gate of the further first switch (e.g., to a gate of the further first transistor).

In example 45 the charge pump of one of examples 1 to 44 is configured such that, when supplied with a supply voltage (e.g., VDD), one or more (e.g., each) field-effect transistors (e.g., at least the first transistor and/or the second transistor; and/or at least the further first transistor and/or the further second transistor) of the charge pump is stressed to a maximum voltage that is equal to the supply voltage or less than the supply voltage.

In example 46, the charge pump of one of examples 1 to 45 includes that the first field-effect transistor and the second field-effect transistor are configured to suppress a switching of a parasitic bipolar junction in the respective field-effect transistor during operation.

In example 47, the charge pump of one of examples 1 to 46 includes that the further first field-effect transistor and the further second field-effect transistor are configured to suppress a switching of a parasitic bipolar junction in the respective field-effect transistor during operation.

In example 48, the charge pump of one of examples 1 to 47 includes that the first field-effect transistor and the second field-effect transistor are formed at least one of over and in a substrate and are configured to suppress a parasitic current through the respective field-effect transistor into the substrate.

In example 49, the charge pump of one of examples 1 to 48 includes that the further first field-effect transistor and the further second field-effect transistor (e.g., are formed at least one of over and in a substrate and) are configured to suppress a parasitic current through the respective field-effect transistor into the substrate.

While the disclosure has been particularly shown and described with reference to specific aspects, it should be understood by those skilled in the art that various changes in form and detail may be made therein without departing from the spirit and scope of the disclosure as defined by the appended claims. The scope of the disclosure is thus indicated by the appended claims and all changes, which come within the meaning and range of equivalency of the claims, are therefore intended to be embraced.

What is claimed is:

1. A latch-type charge pump, comprising:
   an input node and an output node;
   a first charge storage and a second charge storage coupled in parallel to each other between the input node and the output node,
   a first switch coupled to the input node and a second switch coupled to the output node, wherein the first charge storage couples the first switch with the second switch; and
   a control circuit configured to control the first switch based on a state of the second charge storage, and to control the second switch based on a state of the first charge storage, wherein the control circuit comprises a diode-connected field-effect transistor.

2. The latch-type charge pump of claim 1, wherein the control circuit is configured to supply a control signal based on the state of the first charge storage to a control node of the second switch.

3. The latch-type charge pump of claim 2, wherein the second switch comprises a field-effect transistor and wherein the control node is a gate terminal of the field-effect transistor.

4. The latch-type charge pump of claim 1, wherein the control circuit:
   comprises a controller node; and
   is configured to control the second switch further based on a signal capacitively supplied to the controller node.

5. The latch-type charge pump of claim 1, wherein the diode-connected field-effect transistor couples the first charge storage with the second switch.

6. The latch-type charge pump of claim 5, wherein a control node of the diode-connected field-effect transistor is coupled to a control node of the second switch.

7. The latch-type charge pump of claim 5, wherein a control node of the diode-connected field-effect transistor is coupled to the first charge storage.

8. The latch-type charge pump of claim 1, wherein the first switch includes a first field-effect transistor; and wherein the second switch includes a second field-effect transistor; wherein the first field-effect transistor and the second field-effect transistor are of a same channel doping type.

9. The latch-type charge pump of claim 8, wherein the charge pump is configured such that, when supplied with a supply voltage, each field-effect transistor of the charge pump is stressed to a maximum voltage that is equal to the supply voltage or less than the supply voltage.

10. The latch-type charge pump of claim 1, further comprising:
    a further first switch coupled to the input node and a further second switch coupled to the output node, wherein the second charge storage couples the further first switch with the further second switch; and
    wherein the control circuit is configured to control the further first switch based on a state of the first charge storage, and to supply a signal to a control terminal of the further second switch based on a state of the second charge storage.

11. The latch-type charge pump of claim 1, which has no parasitic bipolar effect.

12. A latch-type charge pump, comprising:
    an input node and an output node;
    a first charge storage and a second charge storage coupled in parallel to each other between the input node and the output node,
    a first field-effect transistor coupled to the input node and a second field-effect transistor coupled to the output node, wherein the first charge storage couples the first field-effect transistor with the second field-effect transistor; and
    wherein the first field-effect transistor and the second field-effect transistor are of a same type of channel doping;
    a control circuit comprising one or more control transistors coupling the first charge storage to the second field-effect transistor and being of the same type of channel doping, wherein the one or more control transistors comprises one or more diode-connected field-effect transistors.

13. The latch-type charge pump of claim 12,
    the control circuit configured to:
    supply a first control signal based on a state of the first charge storage to a gate of the second field-effect transistor; and/or
    supply a second control signal based on a state of the second charge storage to a gate of the first field-effect transistor.

14. The latch-type charge pump of claim 12, further comprising:
    a further first field-effect transistor coupled to the input node and a further second field-effect transistor coupled to the output node, wherein the second charge storage couples the further first field-effect transistor with the further second field-effect transistor; and
    wherein the control circuit is configured to supply a further first signal to a gate of the further second field-effect transistor based on a state of the second charge storage and to supply a further second control signal based on a state of the first charge storage to a gate of the further first field-effect transistor;
    wherein the further first field-effect transistor and the further second field-effect transistor are of the same type of channel doping.

15. The latch-type charge pump of claim 12,
    wherein a gate of the one or more control transistors is coupled to a gate of the second field-effect transistor; or
    wherein a gate of the one or more control transistors is coupled to the first charge storage.

16. The latch-type charge pump of claim 12, wherein the first field-effect transistor and the second field-effect transistor are configured to suppress a parasitic current through the respective field-effect transistor into a substrate.

17. The latch-type charge pump of claim 12, wherein the first field-effect transistor is a first triple well device and the second field-effect transistor is a second triple well device.

18. A latch-type charge pump, comprising:
    an input node and an output node;
    a latch structure comprising a pair of first switches coupled to each other by the input node;

a pair of second switches coupled to each other by the output node, each second switch coupling the latch structure with the output node, a control circuit configured to control the pair of second switches in push-pull configuration and independently from the latch structure, wherein the control circuit comprises a pair of diode-connected field-effect transistors.

19. The latch-type charge pump of claim 18, wherein each switch of the pair of first switches includes a first field-effect transistor; and wherein each switch of the pair of second switches includes a second field-effect transistor; wherein the first field-effect transistor and the second field-effect transistor are of a same type of channel doping.

20. The latch-type charge pump of claim 18, wherein each switch of the pair of first switches is a first triple well device and wherein each switch of the pair of second switches is a second triple well device.

\* \* \* \* \*